(12) United States Patent
Nemoto et al.

(10) Patent No.: US 10,068,998 B2
(45) Date of Patent: Sep. 4, 2018

(54) SEMICONDUCTOR DEVICE AND METHOD OF PRODUCING THE SAME

(75) Inventors: Michio Nemoto, Matsumoto (JP); Haruo Nakazawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 163 days.

(21) Appl. No.: 13/299,870

(22) Filed: Nov. 18, 2011

(65) Prior Publication Data

US 2012/0064706 A1  Mar. 15, 2012

Related U.S. Application Data

(62) Division of application No. 12/358,241, filed on Jan. 22, 2009, now Pat. No. 8,084,814.

(30) Foreign Application Priority Data

Jan. 23, 2008 (JP) ................. 2008-013018

(51) Int. Cl.
*H01L 21/26* (2006.01)
*H01L 21/42* (2006.01)
(Continued)

(52) U.S. Cl.
CPC ........ *H01L 29/7397* (2013.01); *H01L 21/263* (2013.01); *H01L 29/1095* (2013.01);
(Continued)

(58) Field of Classification Search
CPC .. H01L 21/2652; H01L 21/324; H01L 21/263
(Continued)

(56) References Cited

U.S. PATENT DOCUMENTS 6,482,681 B1   11/2002  Francis et al.
6,610,572 B1    8/2003  Takei et al.
(Continued)

FOREIGN PATENT DOCUMENTS

CN         1439172 A      8/2003
JP     2001-102392 A      4/2001
(Continued)

OTHER PUBLICATIONS

Machine translation of JP 2006-351659 to Saito et al., dated Dec. 28, 2006.*
(Continued)

*Primary Examiner* — Hsin-Yi Hsieh
(74) *Attorney, Agent, or Firm* — Rossi, Kimms & McDowell LLP

(57) ABSTRACT

A semiconductor device is provided in which a semiconductor substrate can be prevented from being broken while elements can be prevented from being destroyed by a snap-back phenomenon. After an MOS gate structure is formed in a front surface of an FZ wafer, a rear surface of the FZ wafer is ground. Then, the ground surface is irradiated with protons and irradiated with two kinds of laser beams different in wavelength simultaneously to thereby form an $N^+$ first buffer layer and an N second buffer layer. Then, a P+ collector layer and a collector electrode are formed on the proton-irradiated surface. The distance from a position where the net doping concentration of the $N^+$ first buffer layer is locally maximized to the interface between the P+ collector layer and the N second buffer layer is set to be in a range of 5 μm to 30 μm, both inclusively.

10 Claims, 19 Drawing Sheets

(51) Int. Cl.
    *H01L 29/739*     (2006.01)
    *H01L 29/32*     (2006.01)
    *H01L 29/66*     (2006.01)
    *H01L 29/36*     (2006.01)
    *H01L 21/263*     (2006.01)
    *H01L 29/10*     (2006.01)

(52) U.S. Cl.
    CPC .............. *H01L 29/32* (2013.01); *H01L 29/36* (2013.01); *H01L 29/66348* (2013.01)

(58) Field of Classification Search
    USPC .................................. 438/535; 257/E21.347
    See application file for complete search history.

(56) References Cited

U.S. PATENT DOCUMENTS

| | | |
|---|---|---|
| 6,707,111 B2 | 3/2004 | Francis et al. |
| 7,799,662 B2 | 9/2010 | Nemoto |
| 2001/0005036 A1 | 6/2001 | Porst et al. |
| 2002/0100934 A1 | 8/2002 | Nakagawa et al. |
| 2002/0127783 A1 | 9/2002 | Otsuki et al. |
| 2002/0190281 A1 | 12/2002 | Francis et al. |
| 2003/0080099 A1 | 5/2003 | Tanaka et al. |
| 2003/0211694 A1* | 11/2003 | Takei et al. ................... 438/270 |
| 2006/0081923 A1 | 4/2006 | Mauder et al. |
| 2006/0286753 A1 | 12/2006 | Barthelmess et al. |
| 2007/0091978 A1* | 4/2007 | Tanaka ............... B23K 26/0613 372/109 |
| 2007/0120170 A1 | 5/2007 | Niedernostheide et al. |
| 2009/0227121 A1 | 9/2009 | Matsuno et al. |
| 2010/0244093 A1 | 9/2010 | Rahimo et al. |

FOREIGN PATENT DOCUMENTS

| | | |
|---|---|---|
| JP | 2002-520885 A | 7/2002 |
| JP | 2002-305305 A | 10/2002 |
| JP | 2002-314084 A | 10/2002 |
| JP | 2003-59856 A | 2/2003 |
| JP | 3413021 B2 | 3/2003 |
| JP | 2003-533047 A | 11/2003 |
| JP | 2004-193212 A | 7/2004 |
| JP | 3684962 B2 | 6/2005 |
| JP | 2006-344977 A | 12/2006 |
| JP | 2006-351659 A | 12/2006 |
| JP | 2007-059431 A | 3/2007 |
| JP | 2007-123300 A | 5/2007 |
| WO | 0186712 A1 | 11/2001 |
| WO | 2007-015388 A1 | 2/2007 |
| WO | 2007-055352 A1 | 5/2007 |
| WO | 2009-043870 A1 | 4/2009 |

OTHER PUBLICATIONS

CN Office Action dated Jan. 31, 2012 for corresponding CN200910009888.4 (partial English translation provided).

Japanese Office Action issued in Japanese counterpart application No. JP2008-013018, dated Feb. 19, 2012. English translation provided.

Chinese Office Action cited in Chinese counterpart application No. CN201210567582.2, dated Sep. 26, 2014. English translation provided.

\* cited by examiner

H⁺/B⁺

US 10,068,998 B2

SEMICONDUCTOR DEVICE AND METHOD OF PRODUCING THE SAME

CROSS REFERENCE TO RELATED APPLICATION

This is a divisional of Ser. No. 12/358,241, filed Jan. 22, 2009, for which benefit is claimed, and status is pending, which in turn claims priority from JP Application No. 2008-013018, filed Jan. 23, 2008, the content of which is incorporated herein by reference.

BACKGROUND OF THE INVENTION

The present invention relates to a semiconductor device such as a diode or an IGBT (Insulated Gate Bipolar Transistor) having soft recovery characteristics in addition to high-speed and low-loss characteristics, and a method for producing the semiconductor device.

There are diodes or IGBTs of 600 V, 1200 V or 1700 V withstand voltage class as power semiconductor devices. Improvement of characteristics of these devices has advanced recently. The power semiconductor devices are used in power conversion systems such as a high-efficiency power-saving converter-inverter system and essential for controlling rotation motors and servomotors.

Characteristics of low loss, power saving, high speed, high efficiency and environmental friendliness, that is, no bad influence on surroundings are required of such a power controller. For such requirements, there is commonly known a method of thinning a rear surface of a usual semiconductor substrate (e.g. silicon wafer) by means of grinding or the like after formation of a front surface side region of the semiconductor substrate and then performing ion-injection of an element with a predetermined concentration from the ground surface side and heat treatment (e.g. see Patent Document JP-T-2002-5208851).

For reduction of loss of the semiconductor device, it is necessary to improve the trade-off relationship between turn-off loss and conduction loss (on-voltage). Specifically, when, for example, the surface gate structure is formed as a trench gate structure, the trade-off relationship is improved. When injection of minority carrier from a $P^+$ collector layer to an $N^-$ drift layer is suppressed to reduce the carrier concentration of the $N^-$ drift layer, the trade-off relationship is improved. In addition, when the $N^-$ drift layer is thinned to such a degree that the withstand voltage is not reduced, the trade-off relationship is improved.

FIG. 19 is a view showing the configuration of a semiconductor device having a field stop layer formed according to the related art and the net doping concentration thereof. As shown in a section 400 of the semiconductor device in FIG. 19, for example, an $N^+$ field stop layer 42 and a $P^+$ collector layer 43 are formed in this order on one principal surface side of an $N^-$ drift layer 41. A P base layer 44 is formed on the other principal surface side of the $N^-$ drift layer 41. An N source layer 45 is formed on part of a front surface layer of the P base layer 44 so as to be far from the $N^-$ drift layer 41. A gate electrode 47 is formed through a gate insulating film 46 in a trench which passes through the N source layer 45 and the P base layer 44 and reaches the $N^-$ drift layer 41. An emitter electrode 48 is formed on a surface of the P base layer 44 and the N source layer 45. A collector electrode 49 is formed on a surface of the $P^+$ collector layer 43.

As shown in a characteristic graph 410 of distance from the emitter electrode versus net doping concentration (log) in FIG. 19, the net doping concentration of the $N^+$ field stop layer 42 has a peak near the interface between the $N^+$ field stop layer 42 and the $P^+$ collector layer 43 and higher than the net doping concentration of the $N^-$ drift layer 41. Both the net doping concentrations of the $P^+$ collector layer 43 and the P base layer 44 are higher than the net doping concentrations of the $N^-$ drift layer 41 and the $N^+$ field stop layer 42.

The size of the semiconductor device shown in FIG. 19 is exemplified as follows. The size is based on the interface between the P base layer 44 and the emitter electrode 48 and expressed in distance from this interface except as otherwise noted. The distance to the interface between the P base layer 44 and the $N^-$ drift layer 41 is 3 µm. The distance to the interface between the $P^+$ collector layer 43 and the collector electrode 49 is 140 µm. The distance from the interface between the $N^+$ field stop layer 42 and the $P^+$ collector layer 43 to the interface between the $P^+$ collector layer 43 and the collector electrode 49, that is, the thickness of the $P^+$ collector layer 43 is 0.5 µm. The distance from the interface between the $N^-$ drift layer 41 and the $N^+$ field stop layer 42 to the interface between the $P^+$ collector layer 43 and the collector electrode 49 is 30 µm.

The net doping concentration of the P base layer 44 takes $5\times10^{16}$ atoms/cc at the interface between the P base layer 44 and the emitter electrode 48, decreases in the direction of the $N^-$ drift layer 41 and takes a value lower than $5\times10^{13}$ atoms/cc at the interface between the P base layer 44 and the $N^-$ drift layer 41. The net doping concentration of the $P^+$ collector layer 43 takes $1\times10^{18}$ atoms/cc at the interface between the $P^+$ collector layer 43 and the collector electrode 49, decreases in the direction of the $N^+$ field stop layer 42 and takes a value lower than $5\times10^{13}$ atoms/cc at the interface between the $P^+$ collector layer 43 and the $N^+$ field stop layer 42. The net doping concentration of the $N^-$ drift layer 41 is $5\times10^{13}$ atoms/cc. The maximum value of the net doping concentration of the $N^+$ field stop layer 42 is higher than $5\times10^{13}$ atoms/cc.

With respect to the semiconductor device shown in FIG. 19, a method in which the $N^+$ field stop layer 42 higher in impurity concentration than the $N^-$ drift layer 41 is formed between the $P^+$ collector layer 43 and the $N^-$ drift layer 41 by means of ion injection and thermal activation, for example, after the rear surface of an FZ wafer is ground has been disclosed in Patent Document 1. By the method, injection of minority carriers from the $P^+$ collector layer 43 is reduced so that the on-voltage can be reduced without increase of the turn-off loss.

Further, a method in which after phosphorus serving as the $N^+$ field stop layer and boron serving as the $P^+$ collector layer are ion-injected into a position deep from the rear surface of the wafer, the surface injected with ions is irradiated with two kinds of laser beams different in wavelength is commonly known. According to this method, there is no influence on the MOS gate structure and the metal electrode in the front surface of the wafer, so that damage caused by ion injection into the rear surface of the wafer can be eliminated to recover crystallinity. When, for example, a GaAs (gallium arsenide) semiconductor laser with a wavelength of about 800 nm is used as a long-wavelength laser which is one of the two types of lasers different in wavelength, ions at a depth of about 3 µm from the surface injected with ions can be activated effectively (e.g. see Patent Document WO 2007/015388).

There has been also disclosed a method of activating phosphorus or boron by irradiating the ion-injected surface with a laser beam of one kind of wavelength once or several times at different timing of irradiation after ion injection of phosphorus into a deep position of the rear surface of the wafer. For example, a method of activating phosphorus injected at a depth of about 1.5 µm from the injected surface by controlling the full width at half maximum of the third harmonic (YAG 3ω laser: 355 nm wavelength) of a YAG (Yttrium Aluminum Garnet) laser or the second harmonic (YAG 2ω laser: 532 nm wavelength) of the YAG laser is commonly known (e.g. see Patent Document JP-A-2003-59856 or JP-A-2002-314084).

A method of activating phosphorus injected at a depth of about 1.5 µm from the injected surface by irradiating a tilted substrate with a YAG 2ω laser is also commonly known (e.g. see Patent Document JP-A-2007-059431). A method of activating phosphorus injected at a depth of about 1 µm from the rear surface of the wafer by irradiation with a YAG laser several times is further commonly known (e.g. see Patent Document JP-A-2007-123300). A method of activating phosphorus injected at a depth of about 1 µm from the rear surface of the wafer by irradiation with a GaAs semiconductor laser (690-900 nm wavelength) is further commonly known (e.g. see Patent Document JP-A-2006-351659).

There has been also proposed a technique of forming an $N^+$ field stop layer from a hydrogen-induced donor by injecting not phosphorus but light ions such as hydrogen ions at a high acceleration voltage and performing heat treatment. For example, a method of forming an $N^+$ field stop layer from donor protons by injecting protons into a depth of about 10 µm from the rear surface of the wafer at an acceleration voltage of about 1 MeV and performing heat treatment at 400° C. or higher for two hours or more in an electric furnace is commonly known (e.g. Patent Document JP-A-2006-344977). A method of widening the width of the $N^+$ field stop layer by injecting protons at several stages is also commonly known (e.g. see US Patent Application Publication No. 2006/0081923 or Patent Document JP-T-2003-533047).

The present applicant has proposed a method of injecting protons into an oxygen-including silicon substrate (e.g. see Patent Document WO 2007/055352). According to this method, reduction of carrier mobility caused by injection damage can be suppressed. In addition, a donor several times higher in concentration than only the hydrogen-induced donor can be induced because of the compound defect of oxygen and hydrogen included in the silicon substrate.

FIG. 20 shows results of SRIM2006's calculation of the projected range Rp of protons in silicon irradiated with protons and the full width at half maximum (FWHM) ΔRp thereof in a hydrogen distribution after the irradiation. As shown in FIG. 20, it is found that the projected range Rp and the FWHM ΔRp increase as the acceleration voltage increases.

A further method of forming an $N^+$ field stop layer in a region near a $P^+$ collector layer with respect to the center of an $N^-$ drift layer so that the $N^+$ field stop layer does not come into contact with the $P^+$ collector layer has been disclosed in JP-A-2004-19212 or JP-A-2002-305305. This structure can be formed by combination of epitaxial growth and ion injection using phosphorus or arsenic.

A further method of performing local lifetime control (control of lifetime killer introduction quantity) due to irradiation with light ions such as protons or helium ions has been disclosed in JP-A-2001-102392 or Japanese Patent No. 3413021. Particularly in Japanese Patent No. 3413021, there has been disclosed the concentration of phosphorus in which the lifetime of an $N^+$ field stop layer formed based on phosphorus becomes longer than that of an extremely short lifetime region generated by lifetime control. A further method of forming an N+ field stop layer by laser annealing after irradiation with phosphorus ions or protons has been disclosed (e.g. see Japanese Patent No. 3885598 or Japanese Patent No. 3684962).

In the technique disclosed in JP-T-2002-520885, the final thickness of the wafer however needs to be thin to be about 100 µm particularly in the semiconductor device of a 600 V or 1200 V withstand voltage class, so that the wafer is broken easily at the time of handling. Therefore, to reduce the number of wafer processing steps in a thin state of the wafer as sufficiently as possible, the MOS gate structure and the metal electrode are formed in the front surface of the wafer before the rear surface of the wafer is ground. In the activating process after grinding, heat treatment must be performed at a low temperature not higher than the melting point of the electrode material (e.g. at a temperature not higher than 450° C. and, preferably, at a temperature of about 400° C. when the electrode material is aluminum) because the electrode has been already formed in the front surface of the wafer. There is hence a problem that it is difficult to activate the impurity sufficiently.

In the techniques disclosed in WO 2007/015388, JP-A-2003-59856, JP-A-2002-314084, JP-A-2007-059431, JP-A-2007-123300, and JP-A-2006-351659, the spreading coefficient of phosphorus is so small that phosphorus can be only spread to a depth of about 3 µm from the rear surface of the wafer even when, for example, heat treatment is performed at 1150° C. for 1 hour. Moreover, since the electrode has been already formed in the front surface of the wafer, the temperature for heat treatment after injection cannot be set at a high temperature of 1150° C. and must be set at a low temperature not higher than the melting point of the electrode material. For this reason, phosphorus cannot be spread in silicon so that only about 10% or less of injected phosphorus can be activated by covalent bonding to adjacent silicon in a defective position. Accordingly, the $N^+$ field stop layer can be formed only in a position about 1.5 µm deep from the rear surface of the wafer.

In particular, JP-A-2007-059431 has described that the laser wavelength is set to be shorter than 600 nm because deterioration of device characteristic is caused by increase of the temperature of the MOS gate structure on the front surface side of the substrate when the penetration depth of the laser into the silicon substrate becomes larger. When an element such as phosphorus slow in progress of spreading is used as described above, there is a problem that the $N^+$ field stop layer cannot be formed in a position deep from the injected surface by heat treatment in an electric furnace or laser annealing.

It has been found that there is a problem that the device is destroyed by a snap-back phenomenon caused by flowing of an avalanche current at the time of measuring the withstand voltage of the device in an off state in the trench gate type IBGT when the depth of the N+ field stop layer is about 1.5 µm. Specifically, an avalanche current flows when the positive voltage applied to the collector electrode reaches the withstand voltage of the device in the condition that the gate electrode is electrically connected to the emitter electrode in order to measure the withstand voltage of the device with a curve tracer CT-370A made by Tektronix, Inc. For example, in the case of a 1200 V class device, an avalanche current flows when the voltage reaches about 1400 V. When the current reaches about 100 µA/cm$^2$, negative resistance is exhibited to reduce the voltage rapidly so that the device is destroyed by concentration of the current into one place of the chip. However, this phenomenon does not occur in a punch-through type IGBT produced by use of an epitaxial wafer and a non-punch-through type IGBT produced by use of an FZ bulk wafer.

In the technique disclosed in WO 2007/015388, phosphorus and boron at a depth of about 3 μm from the rear surface side of the substrate can be melted at 1400° C. or higher while increase of the temperature of the front surface of the substrate is suppressed to 400° C. or lower. However, the region in which phosphorus can be activated is about 3 μm whereas the penetration length of the laser with a long wavelength of 808 nm is 17.5 μm. Accordingly, in atoms such as phosphorus having a relatively small spreading coefficient, crystal recovery and donor activation due to substitution for defects can be achieved only in a region about one sixth the penetration length of the laser. For this reason, there is a problem that the merit of the long-wavelength laser to increase the penetration length cannot be used sufficiently.

JP-T-2002-520885 has disclosed a method of forming an N+ field stop layer by using atoms such as selenium (Se) or sulfur (S) having a larger spreading coefficient than that of phosphorus. According to the technique disclosed in Patent Document 1, an N$^+$ field stop layer can be formed in a position about 15-20 μm deep from the rear surface of the wafer by spreading. When the N$^+$ field stop layer is formed in a deep position of the rear surface of the wafer in this manner, the snap-back phenomenon does not occur. However, in order to form the N$^+$ field stop layer in a position about 15-20 μm deep from the rear surface of the wafer, heat treatment, for example, at 1000° C. must be performed for 1 hour. Accordingly, the N$^+$ field stop layer must be formed before the MOS gate structure and the electrode are formed in the front surface of the wafer. There is hence a problem that the possibility of breaking of the wafer increases because the number of wafer processing steps in a thin state of the wafer increases.

In the aforementioned technique disclosed in JP-A-2006-344977, US Patent Application Publication No. 2006/0081923, Japanese Patent No. 3885598 or Japanese Patent No. 3684962, the N$^+$ field stop layer can be formed by grinding the rear surface of the wafer after formation of the surface structure and the electrode in the front surface of the wafer and injecting light ions such as protons in a position deep from the ground surface to make the light ions serve as donors. Accordingly, the number of wafer processing steps in a thin state of the wafer can be reduced. However, an activating process must be performed in an electric furnace for 2 hours or more, preferably, 2.5 hours or more after irradiation with protons. There is a problem that throughput is lowered. In addition, the reason and effect of the depth of injection of light ions such as protons are obscure.

Moreover, in the technique disclosed in US Patent Application Publication No. 2006/0081923, there is a problem that increase in cost is caused by increase in the number of irradiations because protons are injected in the form of a plurality of steps. Although there is description that the temperature for heat treatment is not lower than 400° C., characteristics such as contact deteriorate because the electrode having been already formed in the front surface of the wafer is scorched or oxidized when, for example, the temperature reaches 500° C. or higher. In addition, the description of treating time is obscure.

Moreover, in the technique disclosed in JP-A-2006-344977 or US Patent Application Publication No. 2006/0081923, the width of the N$^+$ field stop layer is about 2 μm. The reason is that the full width at half maximum (FWHM) in the horizontal direction is 0.7 μm because the acceleration voltage is 1.0 MeV. Accordingly, the N$^+$ field stop layer is so narrow that change of electric field intensity in the N$^+$ field stop layer becomes precipitous. Accordingly, when the depletion layer reaches the N$^+$ field stop layer in a turn-off state, the voltage amplification rate (dV/dt) increases to cause electromagnetic noise. In addition, in order to make the narrow N$^+$ field stop layer perform its function, a concentration of at least $2\times10^{15}$ atoms/cm$^2$ is required. There is hence a problem that throughput is lowered because the dose quantity of injected protons must be set at $1\times10^{15}$ atoms/cm$^2$ or more. On the other hand, when the concentration of the N$^+$ field stop layer is reduced, there is a problem that the leakage current increases.

SUMMARY OF THE INVENTION

To solve the aforementioned problems in the related art, the present invention provided a semiconductor device which has soft recovery characteristics in addition to high-speed low-loss characteristics and in which elements can be prevented from being destroyed by a snap-back phenomenon, and a method of producing the semiconductor device. The invention also provides a method of producing a semiconductor device, in which a semiconductor substrate can be prevented from being broken.

In accordance with an aspect of the invention, there is provided a semiconductor device including: a first semiconductor layer of a first conductivity type; a second semiconductor layer of the first conductivity type being higher in concentration than the first semiconductor layer and provided so as to be in contact with the first semiconductor layer on a side of a first principal surface of the first semiconductor layer; a third semiconductor layer of the first conductivity type being lower in concentration than the second semiconductor layer and provided so as to be in contact with the second semiconductor layer; a fourth semiconductor layer of a second conductivity type being higher in concentration than the first semiconductor layer and provided so as to be in contact with the third semiconductor layer; a fifth semiconductor layer of the second conductivity type being higher in concentration than the first semiconductor layer and provided so as to be in contact with the first semiconductor layer on a side of a second principal surface of the first semiconductor layer; a sixth semiconductor layer of the first conductivity type provided selectively on a surface of the fifth semiconductor layer; an MOS gate structure including a gate insulating film being in contact with a portion of the fifth semiconductor layer put between the first semiconductor layer and the sixth semiconductor layer, and a gate electrode being in contact with the gate insulating film; a first electrode being in contact with at least one part of the fifth semiconductor layer; and a second electrode being in contact with at least one part of the fourth semiconductor layer; wherein a distance from a position where a net doping concentration of the second semiconductor layer is locally maximized to an interface between the third semiconductor layer and the fourth semiconductor layer is in a range of 5 μm to 30 μm, both inclusively.

In one preferred embodiment, the MOS gate structure is formed so that the gate insulating film and the gate electrode being in contact with the gate insulating film are provided in a trench which passes through the fifth and sixth semiconductor layers and reaches the first semiconductor layer.

In another preferred embodiment, a half of a value obtained by multiplying the maximum value of the net doping concentration of the second semiconductor layer and the full width at half maximum of the second semiconductor layer is not smaller than $5×10^{11}$ atoms/cm$^3$ and, preferably, not smaller than $6×10^{11}$ atoms/cm$^3$.

In a further preferred embodiment, the maximum value of the net doping concentration of the second semiconductor layer is not smaller than $1.0×10^{15}$ atoms/cm$^3$; and the full width at half maximum of the second semiconductor layer is not smaller than 2.5 µm and, preferably, not smaller than 3 µm.

In a still further preferred embodiment, each of the second and third semiconductor layers contains any one atom of hydrogen, helium, lithium and oxygen as an electrically activated dopant.

Another preferred embodiment further includes a seventh semiconductor layer being higher in net doping concentration than the third semiconductor layer and provided between the third semiconductor layer and the fourth semiconductor layer.

According to another aspect of the invention, there is provided a semiconductor device including: a first semiconductor layer of a first conductivity type; a second semiconductor layer of the first conductivity type being higher in concentration than the first semiconductor layer and provided so as to be in contact with the first semiconductor layer on a side of a first principal surface of the first semiconductor layer; a third semiconductor layer of the first conductivity type being higher in concentration than the second semiconductor layer and provided so as to be in contact with the second semiconductor layer; a fourth semiconductor layer of a second conductivity type being higher in concentration than the first semiconductor layer and provided so as to be in contact with the first semiconductor layer on a side of a second principal surface of the first semiconductor layer; a first electrode being in contact with at least one part of the fourth semiconductor layer; and a second electrode being in contact with at least one part of the third semiconductor layer; wherein a distance from a position where a net doping concentration of the second semiconductor layer is locally maximized to an interface between the second semiconductor layer and the third semiconductor layer is in a range of 5 µm to 30 µm, both inclusively.

According to a further aspect of the invention, there is provided a method of producing a semiconductor device including the steps of: grinding a first principal surface of a semiconductor substrate of the first conductivity type as the first semiconductor layer (grinding step); injecting light ions into a surface of the first semiconductor layer exposed by the grinding step (injection step); irradiating the surface injected with the light ions with two types of laser beams different in wavelength to thereby electrically activate the injected light ions (irradiation step); and forming a second electrode by laminating a metal film on the surface irradiated with the laser beams (electrode forming step); wherein: a penetration length of a short-wavelength laser beam as one of the two types of laser beams into the semiconductor substrate is in a range of 0.3 µm to 5 µm, both inclusively; and a penetration length of a long-wavelength laser beam as the other of the two types of laser beams into the semiconductor substrate is in a range of 5 µm to 30 µm, both inclusively.

In a further preferred embodiment the irradiation step performs simultaneous irradiation with the two types of laser beams different in wavelength.

In a still further preferred embodiment, the short-wavelength laser beam is emitted from any one of an all-solid-state laser, a gallium nitride-including semiconductor laser and a gas laser, the all-solid-state laser selected from the group consisting of a YAG 2ω laser, a YVO$_4$ 2ω laser and a YLF 2ω laser, the gas laser selected from the group consisting of an excimer laser and a helium-neon laser.

A method of producing a semiconductor device according to the invention is also provided, wherein the laser beam with a long wavelength is emitted from any one of a semiconductor laser containing gallium as part of its structure, a ruby laser and a normal-frequency all-solid-state laser selected from the group consisting of a YAG laser, a YVO$_4$ laser and a YLF laser.

A method of producing a semiconductor device according to the invention is also provided wherein the long-wavelength laser beam is emitted from either of an Al$_X$Ga$_{1-X}$As laser and an In$_X$Ga$_{1-X}$As laser in which X expresses a stoichiometric composition ratio (normalized composition ratio).

A method of producing a semiconductor device according to the invention is also provided, wherein the light ions are selected from the group consisting of protons, helium ions, lithium ions, and oxygen ions.

A method of producing a semiconductor device according to the invention is also provided, wherein the light ions are protons.

A method of producing a semiconductor device according to the invention is also provided, wherein the injection step injects the light ions at an acceleration voltage in a range of 200 keV to 30 MeV, both inclusively.

A method of producing a semiconductor device according to the invention is also, wherein the injection step injects protons at an acceleration voltage in a range of 200 keV to 2 MeV, both inclusively.

According to the above, the distance from a position where the net doping concentration of the second semiconductor layer is locally maximized to the interface between the third semiconductor layer and the fourth semiconductor layer is so long that the distance from an end portion of a depletion layer to the third semiconductor layer becomes long even when an avalanche current begins to flow because of application of a high voltage between the collector and the emitter in an off state. For this reason, the current can be prevented from being concentrated into one place.

The method of the present invention provides the steps of: grinding a rear surface of a wafer after formation of an MOS gate structure in a front surface of the wafer; injecting light ions into the rear surface of the wafer; and simultaneously irradiating the rear surface of the wafer with two types of laser beams different in wavelength, so that the second semiconductor layer can be formed in a position deep from the rear surface of the wafer without influence on the MOS gate structure in the front surface of the wafer.

In the semiconductor device and the producing method thereof according to the invention, there is an effect that the semiconductor device has soft recovery characteristics in addition to high-speed low-loss characteristics, and that elements can be prevented from being destroyed by a snap-back phenomenon. In addition, there is an effect that the semiconductor substrate can be prevented from being broken.

BRIEF DESCRIPTION OF THE DRAWINGS

The invention will be described with reference to certain preferred embodiments and accompanying drawings, wherein:

FIG. 2-1 is a view showing a process of producing the semiconductor device according to Embodiment 1;

FIG. 2-2 is a view showing a process of producing the semiconductor device according to Embodiment 1;

FIG. 2-3 is a view showing a process of producing the semiconductor device according to Embodiment 1;

FIG. 2-4 is a view showing a process of producing the semiconductor device according to Embodiment 1;

FIG. 2-5 is a view showing a process of producing the semiconductor device according to Embodiment 1 and a profile of net doping concentration;

FIG. 3 is a view showing the size and net doping concentration of each portion from the center of an N⁻ drift layer to a collector electrode in the semiconductor device according to Embodiment 1;

FIG. 4 is a characteristic graph showing the relationship between the collector-emitter voltage and the collector current amplification rate;

FIG. 5 is a graph showing a result of conversion of the spreading resistance of the semiconductor device according to Embodiment 1 into a carrier concentration;

FIG. 7-1 is a characteristic graph showing temperature at a depth from the wafer surface, versus elapsed time from a point of time when laser irradiation was terminated;

FIG. 7-2 is a characteristic graph showing temperature at a depth from the wafer surface, versus elapsed time from a point of time when laser irradiation was terminated;

FIG. 7-3 is a characteristic graph showing temperature at a depth from the wafer surface, versus elapsed time from a point of time when laser irradiation was terminated;

FIG. 18-1 is a diagram showing an example of use of IGBTs and diodes according to the invention;

FIG. 18-2 is a diagram showing an example of use of IGBTs and diodes according to the invention;

DETAILED DESCRIPTION OF THE PREFERRED EMBODIMENTS

Preferred embodiments of the invention as to a semiconductor device and a producing method thereof will be described below in detail with reference to the accompanying drawings. Incidentally, in the following description of embodiments and all the accompanying drawings, like numerals refer to like constituent parts for the sake of omission of duplicate description.

Figure 1:
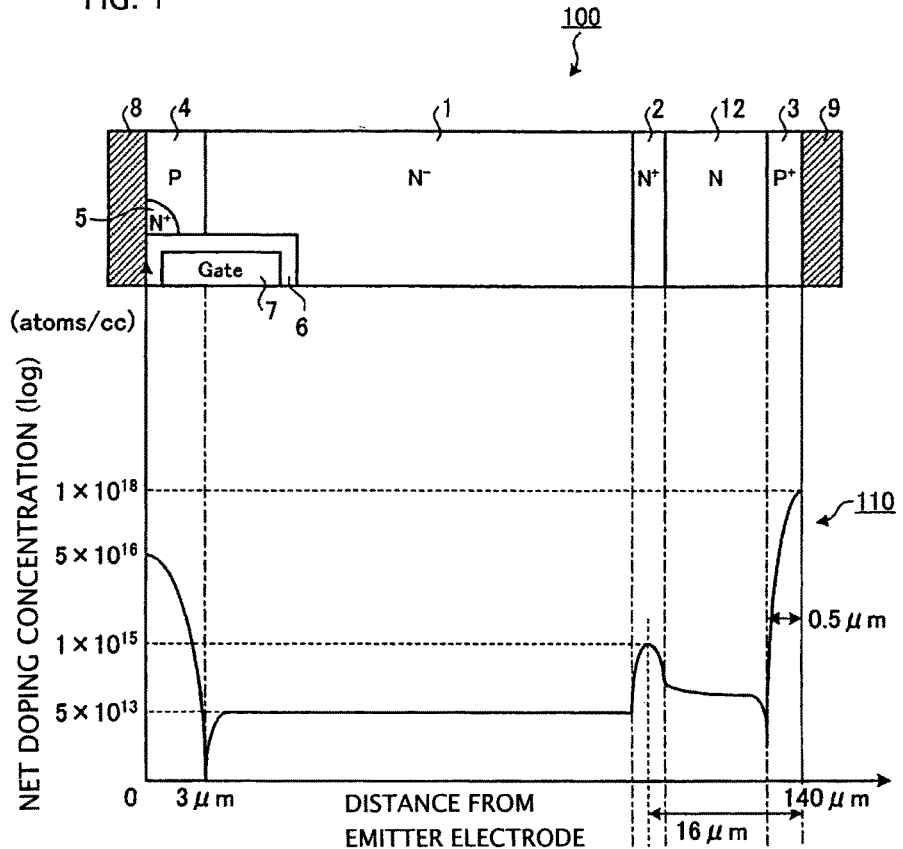
FIG. 1 is a view showing the configuration of a semiconductor device according to Embodiment 1 and the net doping concentration thereof.

FIG. 1 is a view showing the configuration of a semiconductor device according to Embodiment 1 and the net doping concentration thereof. As shown in a section 100 of the semiconductor device in FIG. 1, for example, an N⁺ first buffer layer (N⁺ field stop layer) 2 as a second semiconductor layer, an N second buffer layer 12 as a third semiconductor layer and a P⁺ collector layer 3 as a fourth semiconductor layer are formed in this order on one principal surface (first principal surface) of an N⁻ drift layer 1 as a first semiconductor layer. A P base layer 4 as a fifth semiconductor layer is formed on the other principal surface (second principal surface) of the N⁻ drift layer 1. An N source layer 5 as a sixth semiconductor layer is formed in part of a surface layer of the P base layer 4 so as to be far from the N⁻ drift layer 1. A gate electrode 7 is formed through a gate insulating film 6 in a trench which passes through the N source layer 5 and the P base layer 4 and reaches the N⁻ drift layer 1. An emitter electrode 8 as a first electrode is formed on a surface of the P base layer 4 and the N source layer 5. A collector electrode 9 as a second electrode is formed on a surface of the P⁺ collector layer 3.

As shown in a characteristic graph 110 of distance from the emitter electrode versus net doping concentration (log) in FIG. 1, the net doping concentration of the N⁺ first buffer layer 2 has a peak near the midpoint of the N⁺ first buffer layer 2 and higher than the net doping concentration of the N⁻ drift layer 1. The net doping concentration of the N second buffer layer 12 is higher than that of the N⁻ drift layer 1 but lower than the peak value of the net doping concentration of the N⁺ first buffer layer 2. The net doping concentration of the N second buffer layer 12 decreases with a gradient in the direction from the interface between the N second buffer layer 12 and the N⁺ first buffer layer 2 to the interface between the N second buffer layer 12 and the P⁺ collector layer 3. Both the net doping concentrations of the P⁺ collector layer 3 and the P base layer 4 are higher than the net doping concentrations of the N⁻ drift layer 1, the N⁺ first buffer 2 and the N second buffer layer 12.

The net doping concentration and size when the semiconductor device according to Embodiment 1 was produced with a chip size of 8 mm×8 mm, a 1200 V withstand voltage class and a rating current of 75 A are shown as an example.

The size is based on the interface between the P base layer 4 and the emitter electrode 8 and expressed in distance from this interface except as otherwise noted.

The distance to the interface between the P base layer 4 and the N⁻ drift layer 1 is 3 μm. The distance to the interface between the P⁺ collector layer 3 and the collector electrode 9 is 140 μm. The distance from the interface between the N second buffer layer 12 and the P⁺ collector layer 3 to the interface between the P⁺ collector layer 3 and the collector electrode 9, that is, the thickness of the P⁺ collector layer 3 is 0.5 μm. The distance from the peak position of the net doping concentration of the N⁺ first buffer layer 2 to the interface between the P⁺ collector layer 3 and the collector electrode 9, that is, the projected range Rp of protons is 16 μm.

The net doping concentration of the P base layer 4 takes $5\times10^{16}$ atoms/cc at the interface between the P base layer 4 and the emitter electrode 8, decreases in the direction of the N⁻ drift layer 1 and takes a value lower than $5\times10^{13}$ atoms/cc at the interface between the P base layer 4 and the N⁻ drift layer 1. The net doping concentration of the P⁺ collector layer 3 takes $1\times10^{18}$ atoms/cc at the interface between the P⁺ collector layer 3 and the collector electrode 9, decreases in the direction of the N second buffer layer 12 and takes a value lower than $5\times10^{13}$ atoms/cc at the interface between the P⁺ collector layer 3 and the N second buffer layer 12. The net doping concentration of the N⁻ drift layer 1 is $5\times10^{13}$ atoms/cc. The maximum value of the net doping concentration of the N⁺ first buffer layer 2 is $1\times10^{15}$ atoms/cc. Although either atoms/cc or atoms/cm³ will be used as a unit of concentration in the following description, "cc" and "cm³" are equivalent to each other.

Figures 1, 2:
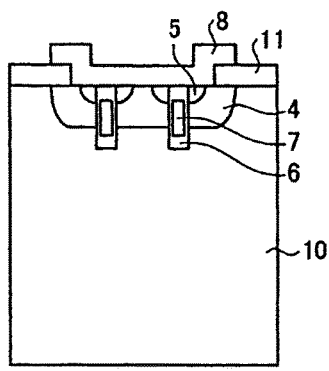
Figure 2:
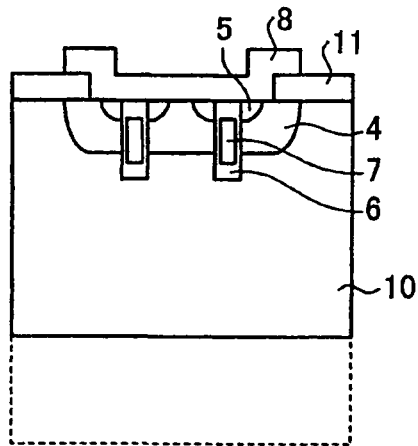

A process of producing the semiconductor device according to Embodiment 1 will be described below. Production of a semiconductor device (withstand voltage: 1200 V class, rating current: 75 A) having the size and net doping concentration shown in FIG. 1 will be described as an example. FIGS. 2-1 to 2-5 are views showing the producing process. First, as shown in FIG. 2-1, an FZ wafer 10 having a specific resistance of 40 to 80 Ωcm (e.g. 55 Ωcm) and a diameter of 6 inches is prepared as a semiconductor substrate. Then, a P base layer 4, an N source layer 5, a gate insulating film 6, a gate electrode 7, an insulating film 11 and an emitter electrode 8 are formed by a standard trench gate type MOS device forming process. For example, the material of the emitter electrode 8 is aluminum (Al).

Then, as shown in FIG. 2-2, the rear surface of the FZ wafer 10 is ground or wet-etched to set the thickness of the FZ wafer 10 at a predetermined value. In the case of 1200 V class, the thickness of the FZ wafer 10 is typically 100 to 160 μm at this point of time. For example, in Embodiment 1, the thickness of the FZ wafer 10 is 140 μm at this point of time.

Figures 2, 3:
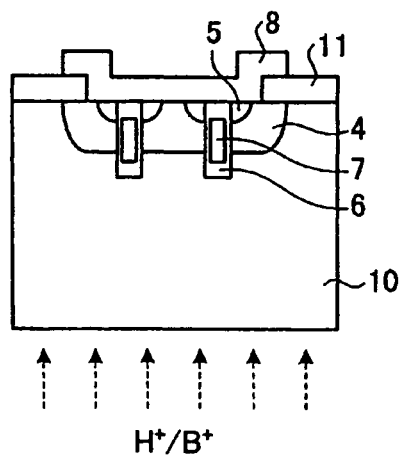

Then, as shown in FIG. 2-3, the ground or wet-etched surface is irradiated with protons (H⁺). On this occasion, the acceleration voltage is, for example, 1 MeV, and the dose quantity of protons is, for example, $1\times10^{14}$ atoms/cm². On this occasion, the projected range Rp of protons is 16 μm from the ion-irradiated surface. Then, boron ions (B⁺ or BF₂) are injected into the rear surface of the FZ wafer 10. On this occasion, the acceleration voltage is, for example, 50 keV, and the dose quantity of boron ions is, for example, $1\times10^{13}$ atoms/cm².

Figures 2, 3, 4:
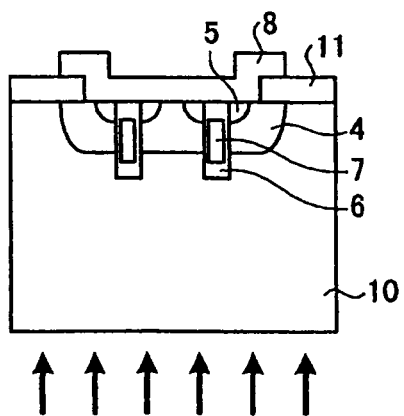

Then, as shown in FIG. 2-4, the ion-injected surface is irradiated with a YAG 2ω laser (wavelength: 500 nm) and a GaAs semiconductor laser (wavelength: 808 nm) simultaneously. The energy for laser beam irradiation is, for example, 200 mJ/cm² for the YAG 2ω laser and 4000 mJ/cm² for the semiconductor laser.

Then, as shown in FIG. 2-5, crystal defects caused by proton irradiation are recovered so that a high-concentration region 13 is formed in a region of proton projected range Rp±FWHM ΔRp from the ion-injected surface. In the high-concentration region 13, a region of from Rp−ΔRp to Rp+ΔRp serves as an N⁺ first buffer layer. The net doping concentration of a proton pass region (from the ion-injected surface to the position of Rp−ΔRp) becomes higher than the bulk concentration. The proton pass region serves as an N second buffer layer. The bulk concentration is the net doping concentration of the FZ wafer 10.

Then, a P-type impurity such as boron is electrically activated to form a P⁺ collector layer 3. Then, a polyimide film, for example, 5 μm thick is applied on a surface of the P⁺ collector layer 3 and patterned to form a passivation film in an edge region not shown. Then, the surface of the P⁺ collector layer 3 is coated with aluminum, titanium (Ti), nickel (Ni) and gold (Au) successively to form a collector electrode 9 in ohmic contact with the P⁺ collector layer 3. Thus, a semiconductor device is completed. A portion of the FZ wafer between the P base layer 4 and the high-concentration region 13 serves as an N⁻ drift layer. The characteristic graph of FIG. 2-5 is a profile of the net doping concentration corresponding to the semiconductor device shown in FIG. 2-5.

FIG. 3 is a graph showing the size and net doping concentration of each portion from the center of the N⁻ drift layer to the collector electrode in the semiconductor device according to Embodiment 1. As shown in FIG. 3, the distance to the peak position of the net doping concentration of the N⁺ first buffer layer is set as Xp with the PN junction between the N second buffer layer and the P+ collector layer as a base of measurement of the distance. In the semiconductor device according to Embodiment 1, Xp is in a range of 5 μm to 30 μm, both inclusively. This reason will be described later.

FIG. 4 is a characteristic graph showing the relationship between collector-emitter voltage and collector current amplification rate. The collector current amplification rate in the condition that an avalanche current begins to flow because a voltage BV very near the withstand voltage of the device is applied between the collector and the emitter in an off state of the device is shown in FIG. 4.

The collector current amplification rate $I_C/I_L$ is given by the following expression (1).

$$I_C/I_L = 1/(1-\alpha_{PNP}^{\textit{eff}}) \tag{1}$$

in which $I_C$ is a collector current when a voltage BV is applied between the collector and the emitter, $I_L$ is a leakage current in the condition that the P⁺ collector layer has not been formed in the rear surface of the FZ wafer, and $\alpha_{PNP}^{\textit{eff}}$ is an effective amplification rate when the voltage BV is applied. When the voltage BV is applied between the collector and the emitter, a depletion layer reaches a range of from the N⁻ drift layer to the N⁺ first buffer layer so that a neutral region of zero space charge is sufficiently shortened in the N⁺ first buffer layer. The collector current amplification rate in this condition is $\alpha_{PNP}^{\textit{eff}}$.

The effective amplification rate $\alpha_{PNP}^{\textit{eff}}$ is given by the following expression (2) and has a value smaller than 1.0.

$$\alpha_{PNP}^{\textit{eff}} = \gamma_E \alpha T M \tag{2}$$

in which $\gamma_E$ is a hole injection efficiency from the emitter side, $\alpha T$ is a transport efficiency in the drift layer, and M is an amplification coefficient due to impact ionization.

When a positive bias is applied to the collector in an off state of the IGBT, the depletion layer is spread from the emitter side into the drift layer so that the neutral region width in the drift layer is reduced as the applied voltage is increased. Accordingly, the effective base width of the PNP transistor is reduced and $\gamma_E$ increases, so that $\alpha_{PNP}$ increases. Such $\alpha_{PNP}$ changing according to the applied voltage is called "effective amplification rate" in this specification and expressed as $\alpha_{PNP}^{eff}$ in distinction from static $\alpha_{PNP}$.

The transport efficiency $\alpha T$ is given by the following expression (3).

$$\alpha T = 1/(\cos h(L_{CNZ}/L_P)) \tag{3}$$

in which $L_{CNZ}$ is the residual width of the neutral region, and $L_P$ is the extended length of holes. The neutral region residual width $L_{CNZ}$ is the width of the neutral region which has been not yet extinguished from the drift layer (the N⁻ drift layer, the N⁺ first drift layer and the N second buffer layer) by the depletion layer spread from the emitter side into the drift layer.

The amplification coefficient M due to impact ionization is given by the following expression (4).

$$M = 1/(1-(V/V_{PP})^6) \tag{4}$$

in which V is the applied voltage, and $V_{PP}$ is an ideal withstand voltage value of a diode formed between one stepped front surface and the other, PN junction surface parallel to the substrate surface.

In FIG. 4, $L_{CNZ}$ is changed from 0.1 μm to 30 μm. In FIG. 4, $V_{PP}$ is 1450 V and $\gamma_E$ is 0.3. As shown in FIG. 4, the collector current amplification rate increases rapidly at a voltage value lower than $V_{PP}$. This reason is commonly known and description thereof is omitted but the rapid increase of the collector current amplification rate is caused by an operation of opening the base of the PNP transistor.

The withstand voltage of the PNP transistor is a voltage when the collector current amplification rate increases rapidly. Accordingly, the withstand voltage of the PNP transistor is approximately 1334.4 V when $L_{CNZ}$ is in a range of 0.1 μm to 3 μm but the withstand voltage of the PNP transistor increases when $L_{CNZ}$ is not smaller than 5 μm. When $L_{CNZ}$ is 30 μm, the withstand voltage of the PNP transistor is 1335.3 V. In comparison between the $L_{CNZ}$ range of 0.3 μm to 3 μm and the region of $L_{CNZ}$ of 30 μm, the withstand voltage of the PNP transistor increases at a small rate which is about 0.1% of the applied voltage.

A trench gate structure device according to the related art will be described here. In the case where phosphorus is used for forming a field stop layer having a thickness of 1 μm or less in a trench gate structure device according to the related art, the distance from an end of a depletion layer to a P⁺ collector layer is about 0.3 μm when the depletion layer reaches the field stop layer. For this reason, the effective injection efficiency is near 1. On this occasion, holes injected from the rear surface of the wafer pass through the depletion layer and reaches the front surface side of the wafer. On the front surface side of the wafer, a P base layer is in contact with an emitter electrode. Holes pass through the neighborhood of a gate electrode embedded in the trench in the middle of movement toward the interface between the P base layer and the emitter electrode.

On this occasion, the trench embedded in the gate electrode reaches an N⁻ drift layer. When a high voltage is applied in an off state, electric potential is curved in accordance with the shape of the bottom of the trench so that electric field intensity increases in the bottom of the trench. The reason why electric field intensity increases is that the curvature of the bottom of the trench is higher than that of the P well layer of a planer gate type device. Accordingly, holes are temporarily concentrated into the bottom of the trench. Because further increase of electric field intensity in the bottom of the trench is caused by the concentration of holes as described above, an avalanche breakdown occurs so that electrons are generated. The electrons pass through the depletion layer toward the P⁺ collector layer side and reach the P⁺ collector layer.

The avalanche breakdown causes flowing of a current even when increase of the voltage is a very small value. As a result, injection of holes from the P⁺ collector layer is accelerated to establish a positive feedback state. As a result, the collector current increases. At the same time, carriers in the depletion layer increase so that the electric field intensity distribution changes to make it impossible to keep the high voltage in the N⁻ drift layer.

As a result, the collector-emitter voltage decreases in addition of increase of the current, so that a snap-back phenomenon occurs. The snap-back phenomenon is a phenomenon that the device deteriorates because of concentration of the current into one place of the largest positive feedback.

The trench gate type structure is effective for obtaining a low-loss device. On the other hand, in order to suppress the snap-back phenomenon in the trench gate type device, it is necessary to increase the distance from the end portion of the depletion layer to the P⁺ collector layer in the condition that the depletion layer has reached the field stop layer and has been not spread any more, that is, the distance of the neutral region as much as possible.

It is commonly known that the snap-back phenomenon does not occur in the related-art field stop layer formed by use of Se or S because the distance of the neutral region is about 5 μm or more. This is because the positive feedback is suppressed sufficiently. It is however known that deterioration of the withstand voltage at flowing of a static avalanche current in the field stop layer formed by irradiation with light ions such as protons is caused by the snap-back phenomenon.

Therefore, when $L_{CNZ}$ is set to be not smaller than 5 μm and, preferably, not smaller than 10 μm, the snap-back phenomenon can be avoided even in the trench gate structure device having the field stop layer formed by irradiation with protons. Accordingly, it is preferable that Xp is not smaller than 5 μm because Xp must be equal to or larger than $L_{CNZ}$.

In the method of producing the semiconductor device according to Embodiment 1, a proton projected range Rp, for example, of 16 μm can be obtained when proton irradiation is performed at an acceleration voltage, for example, of 1 MeV. Accordingly, a neutral region can be formed in a position 5 μm or more far from the PN junction. For this reason, the snap-back phenomenon does not occur even when an avalanche current flows at the time of measuring the withstand voltage, so that the withstand voltage of the device does not deteriorate. The actual withstand voltage varies according to the junction terminal structure such as a known guard ring structure, an RESURF (Reduced Surface Field) structure, a combination structure of a guard ring structure and a field plate structure, etc. For example, assume that the junction terminal structure in the semiconductor device according to Embodiment 1 is formed from a combination structure of a guard ring structure and a field plate structure. Accordingly, there is exhibited a value almost equal to the withstand voltage value approximate to a planer junction including a PNP transistor.

Figures 2, 3, 4, 5:
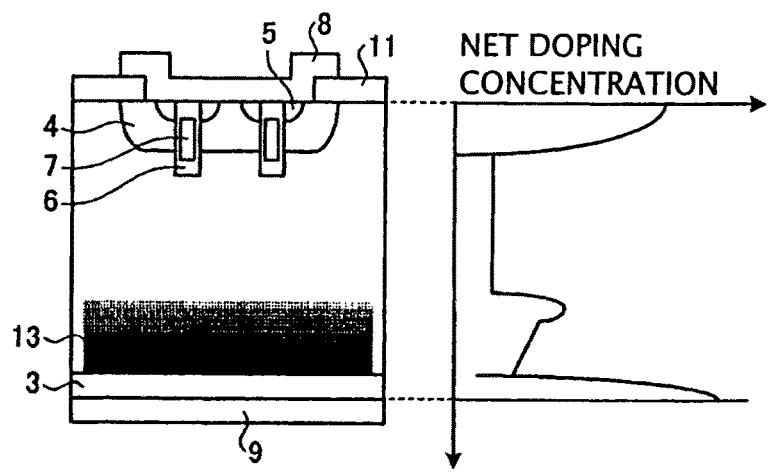
Figure 3:
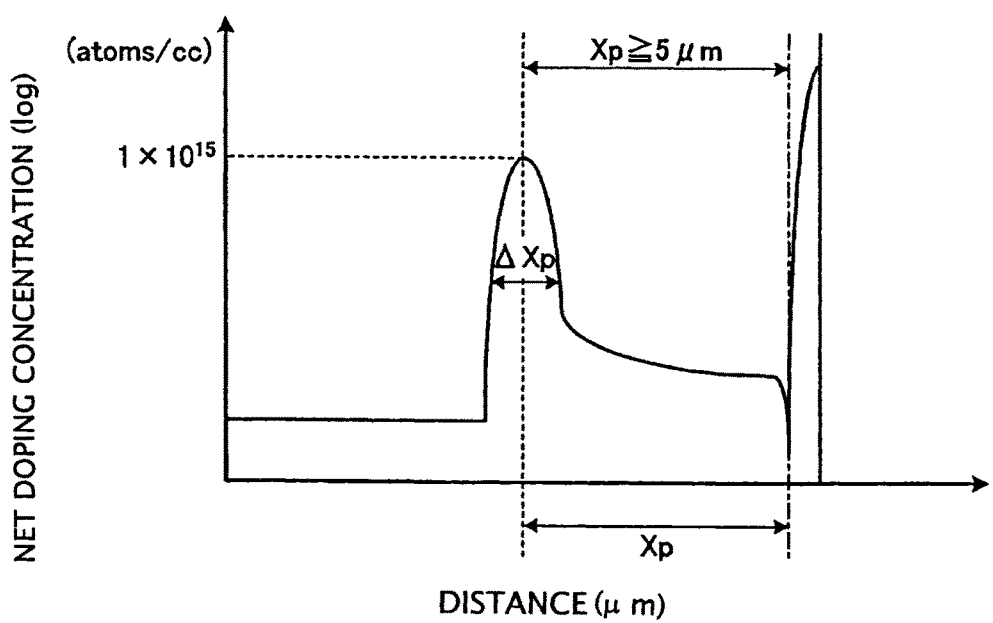
Figure 4:
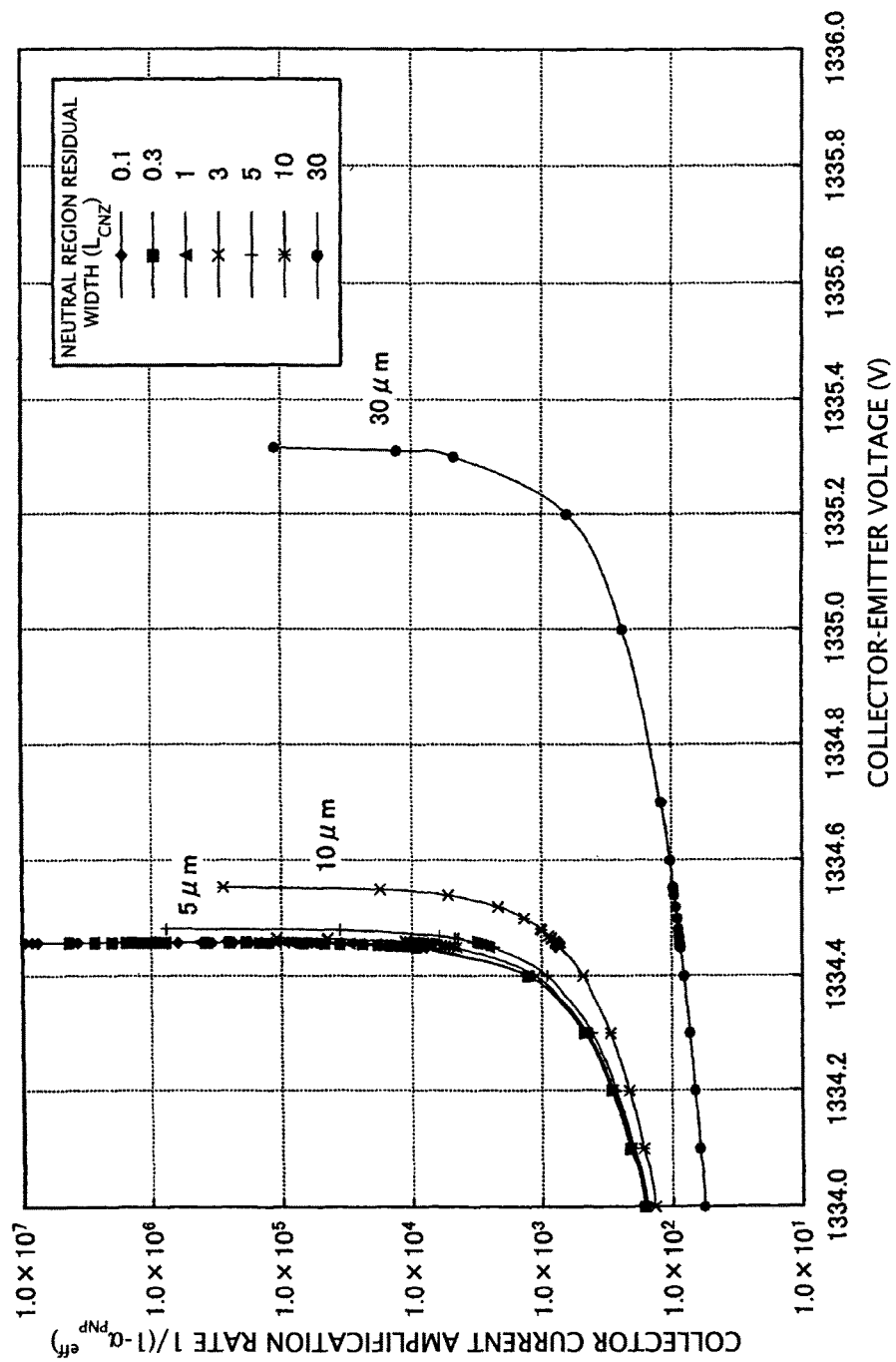
Figure 5:
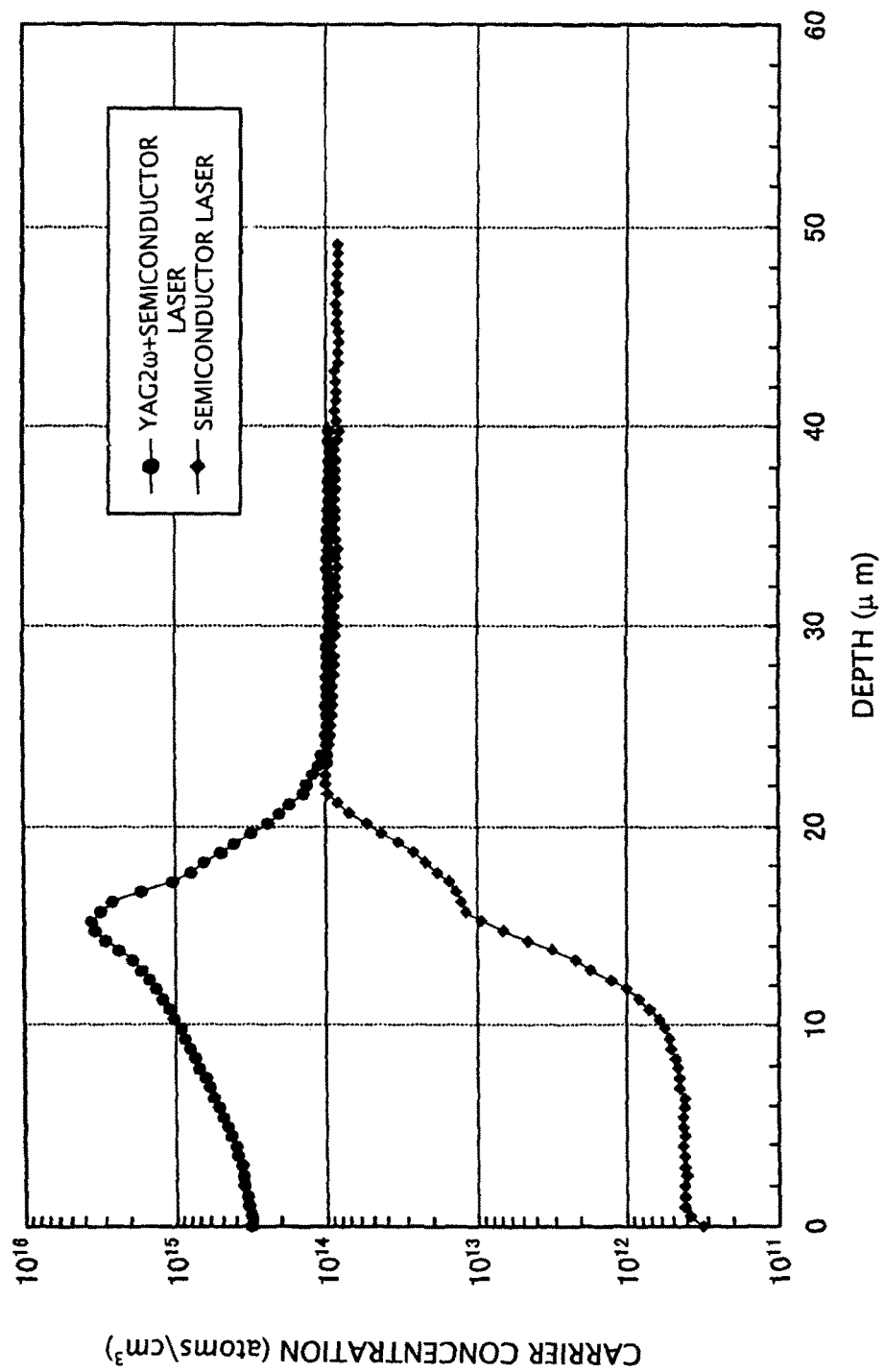

A sample produced as described above was attached to a mount at an angle of 2°52' and ground so that a section of a wafer is exposed. SSM2000 made by Solid State Measurement, Inc. was used for measuring the spreading resistance of the sample. FIG. 5 shows a result of conversion of the resistance value obtained by the measurement into a carrier concentration. In FIG. 5, the vertical axis shows the carrier concentration, and the horizontal axis shows the distance from the wafer surface (proton-irradiated surface), that is, the depth from the wafer surface. In FIG. 5, the circular mark (●) indicates the carrier concentration at the depth when a YAG 2ω laser and a semiconductor laser were applied simultaneously, and the rhombic mark (♦) indicates the carrier concentration at the depth when only the semiconductor laser was applied.

As shown in FIG. 5, it is found that the carrier concentration at the time of application of only the semiconductor laser is lower than at the time of simultaneous application of the YAG 2ω laser and the semiconductor laser. This reason is that damage due to proton irradiation is not recovered and the carrier mobility is reduced so that protons are not activated at the time of application of only the semiconductor laser.

Figure 6:
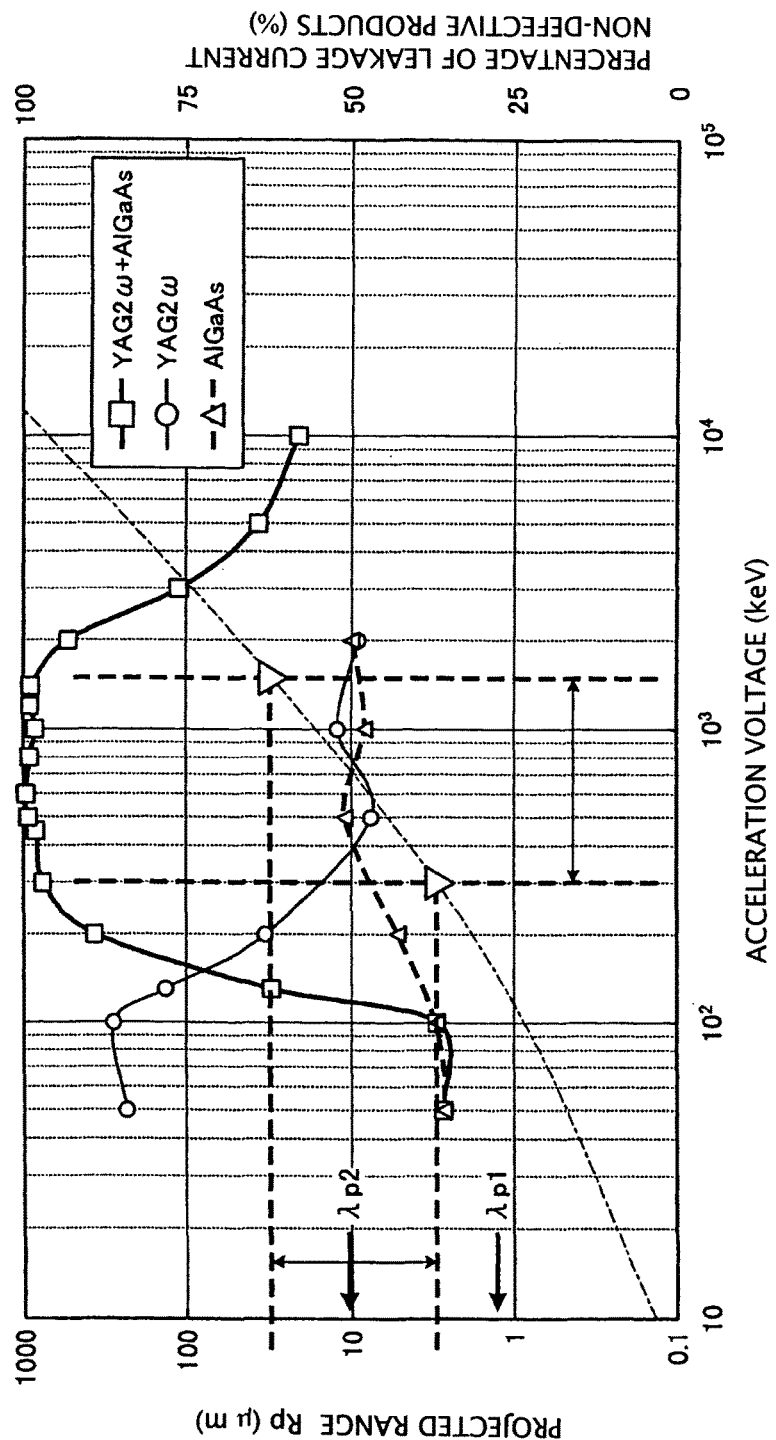
FIG. 6 is a graph showing a result of measurement of the projected range of protons and the percentage of leakage current non-defective products, versus acceleration voltage when protons were injected.

FIG. 6 shows a result of measurement of the projected range of protons and the percentage of leakage current non-defective products, versus acceleration voltage when protons were injected. In FIG. 6, the left side of the vertical axis shows the projected range of protons, the right side of the vertical axis shows the percentage of leakage current non-defective products, and the horizontal axis shows the acceleration voltage. The dose quantity of protons ($H^+$) is $1 \times 10^{14}$ atoms/cm$^2$. In FIG. 6, the thick solid line indicates the percentage of leakage current non-defective products when a YAG 2ω laser (wavelength: 532 nm, penetration length λp1: 1.5 μm) and an AlGaAs laser (wavelength: 808 nm, penetration length λp2: 10 μm) as a GaAs semiconductor laser were applied simultaneously. The thin solid line indicates the percentage of leakage current non-defective products when only the YAG 2ω laser was applied. The thick broken line indicates the percentage of leakage current non-defective products when only the AlGaAs laser was applied. The thin one-dot chain line indicates the projected range of protons.

In this measurement, a voltage of 1200 V is applied between the gate electrode and the emitter electrode so that the resulting product is judged to be non-defective when the current density of the leakage current is lower than 1 μA/cm$^2$ but the resulting product is judged to be defective when the current density of the leakage current is not lower than 1 μA/cm$^2$. The percentage of leakage current non-defective products is the percentage of non-defective chips to the total number of chips in one wafer before the wafer is cut into individual chips by dicing after completion of the wafer producing process.

As shown in FIG. 6, it is found that the percentage of leakage current non-defective products exceeds 95% at an acceleration voltage of 300 keV to 1.3 MeV when the YAG 2ω laser and the AlGaAs laser are applied simultaneously. On the other hand, when only the YAG 2ω laser is applied, the percentage of leakage current non-defective products is about 90% at an acceleration voltage of not higher than 100 keV but the percentage of leakage current non-defective products is about 50% at an acceleration voltage of not lower than 200 keV. When only the AlGaAs laser is applied, the percentage of leakage current non-defective products is about 50% at maximum.

The projected range of protons at the acceleration voltage exhibiting a high percentage of leakage current non-defective products is in a range of about 3 μm to 30 μm. On the other hand, the penetration length λp1 of the YAG 2ω laser into silicon is about 1.5 μm, and the penetration length λp2 of the AlGaAs laser into silicon is about 10 μm.

Accordingly, when only the YAG 2ω laser is applied, protons are not provided as donors in a region deeper than 1.5 μm because the penetration length λp1 of about 1.5 μm is so small that protons cannot be activated in the region deeper than 1.5 μm. In addition, a lot of damages (defects) due to ion injection remain. Because the defects are dispersed in the wafer, the depletion layer reaches the $P^+$ collector layer to cause a punch-through phenomenon. As a result, chips large in leakage current are produced, so that the percentage of leakage current non-defective products is reduced.

When only the AlGaAs laser is applied, the temperature of the front surface (opposite to the laser-irradiated surface) of the wafer increases to about 600° C. because the penetration length λp2 takes a large value of about 10 μm. For this reason, when, for example, an aluminum electrode is formed on a surface opposite to the laser-irradiated surface, the aluminum electrode is melted if the laser output is unchanged as it is. It is therefore necessary to limit the laser output so that the aluminum electrode is not melted. Accordingly, the penetration length is shortened so that provision of protons as donors and recovery of defects cannot be achieved in a region deeper than the penetration length. As a result, a punch-through phenomenon occurs, so that chips large in leakage current are produced to reduce the percentage of leakage current non-defective products.

Figures 1, 7:
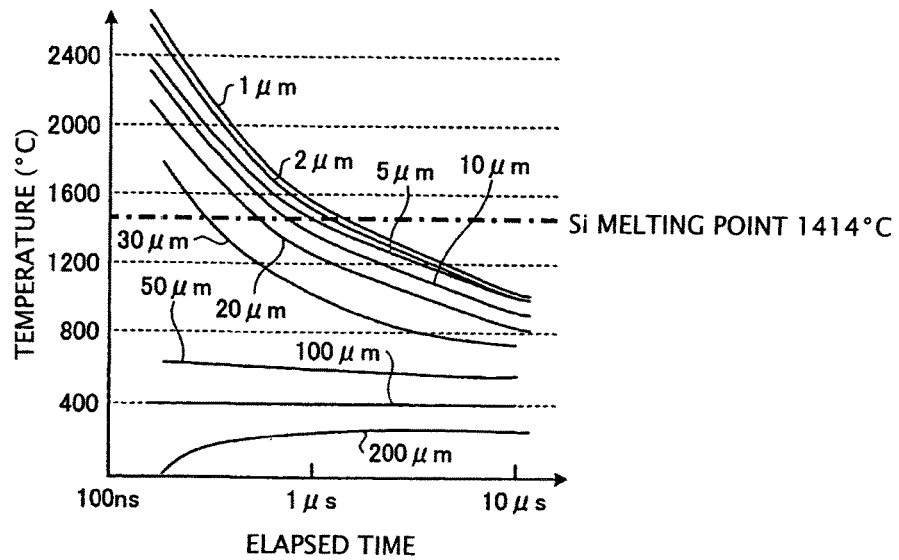
Figures 2, 7:
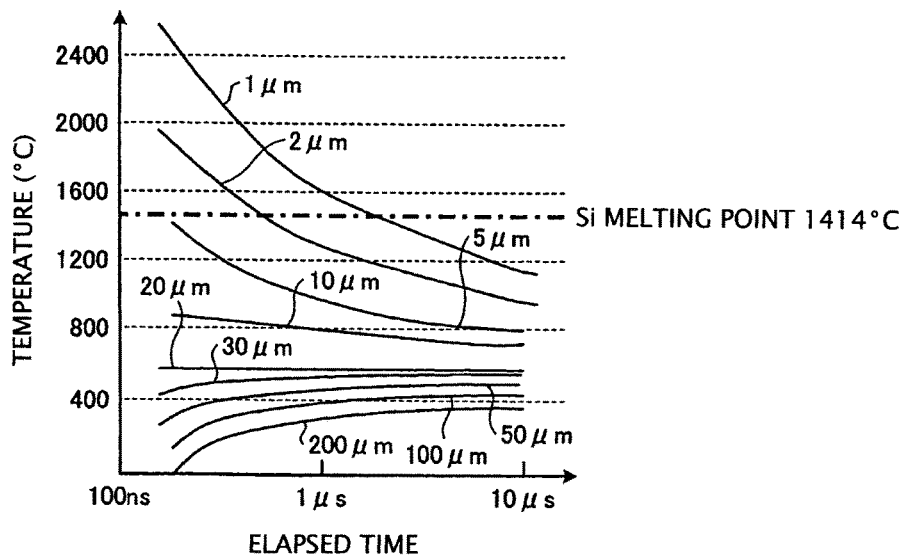
Figures 3, 7:
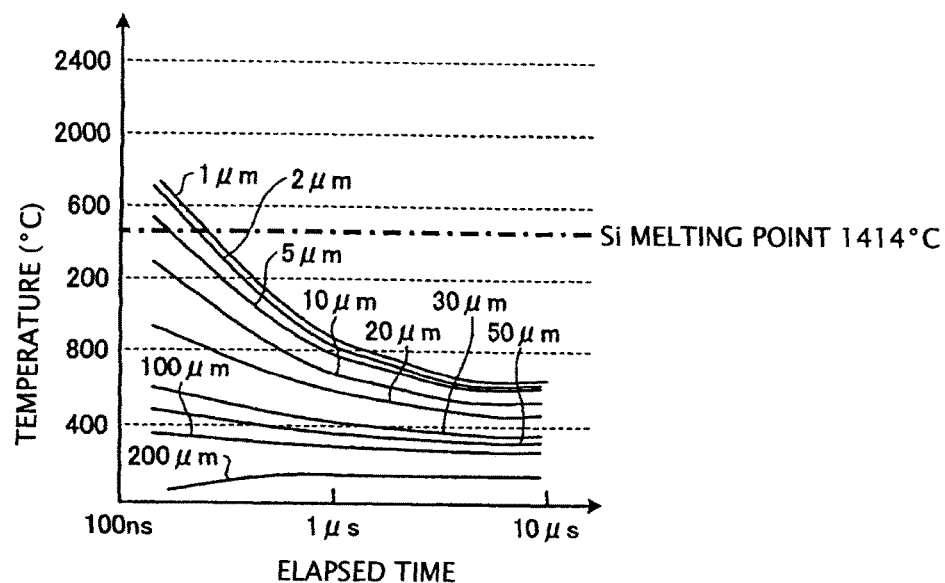

The reason why two kinds of lasers different in penetration length and wavelength are applied will be described. FIGS. 7-1 to 7-3 are characteristic graphs showing temperature at a distance from the wafer surface (laser-irradiated surface), that is, at a depth, versus elapsed time from a point of time when laser irradiation was terminated. FIG. 7-1 shows the case where the YAG 2ω laser and the AlGaAs laser are applied simultaneously. FIG. 7-2 shows the case where only the YAG 2ω laser is applied. FIG. 7-3 shows the case where only the AlGaAs laser is applied.

The temperature distribution was obtained by calculation of difference so that laser beam absorption, heat conduction in solid, radiation from surface and natural convection heat radiation were contained.

Laser beam absorption $I_{OUT}$ was calculated with laser transmittance characteristic as I(x)=10EXP(−u×x), linear absorption coefficient as u=11789.73 cm$^{-1}$, and reflectance of silicon to the YAG 2ω laser as 38%. Accordingly, laser beam absorption $I_{OUT}$ satisfies $I_{OUT} \times (1-0.38)=10$ for the laser output.

Heat conduction dQ/dt in solid is given by the expression (5).

$$dQ/dt = S \cdot \lambda \cdot \Delta T / \Delta x \qquad (5)$$

in which Q is a heat quantity, S is a sectional area, and λ is a heat conductivity.

Radiation E from surface is given by the expression (6).

$$E = \varepsilon \cdot \sigma \cdot T4 \qquad (6)$$

in which σ is a Boltzmann constant, and ε is a radiativity. The natural convection heat radiation was calculated with a natural convection heat radiation coefficient as 10 W/m$^2$K (assumed value).

The region where the effect of laser annealing appears in a short time is a region having a higher temperature than the melting point of the substrate. For example, when the substrate is a silicon substrate, this is a region having a higher temperature than 1414° C. which is the melting point of silicon. When the YAG 2ω laser and the AlGaAs laser are applied simultaneously, the temperature at a depth of 30 μm with the elapsed time up to 300 ns exceeds the melting point (1414° C.) of silicon as shown in FIG. 7-1. The temperature at a depth of 50 μm is 600° C. which is lower than the melting point (660° C.) of aluminum, so that aluminum is not melted in a range having a depth of 50 μm or more.

Though not shown, the temperature at a depth of 50 μm with the elapsed time of 100 μs or more is 400° C. or lower. Accordingly, the aluminum electrode formed on the front surface (opposite to the laser-irradiated surface) of the wafer is not melted. Generally, when annealing is performed at a temperature of 300-400° C. for several hours, protons can be provided as donors. In the case of laser annealing, it is however necessary to change the state of silicon to a melted state or a state close to the melted state because the time required for reducing the temperature after temperature rise is a very short time of 1 μs. According to the invention, because the temperature at a depth of 30 μm or less exceeds the melting point of silicon, protons can be provided as donors by laser annealing. Accordingly, it is understood that Xp is preferably not larger than 30 μm.

On the other hand, when only the YAG 2ω laser is applied, the temperature at a depth of 5 μm or less exceeds the melting point of silicon but becomes lower than the melting point of silicon with the elapsed time of 200 ns or more as shown in FIG. 7-2. Because protons can be provided as donors only at a depth of 5 μm or less, protons cannot be provided as donors sufficiently when the projected range is deeper than 5 μm. At an acceleration voltage of 100 keV or lower to set the projected range of protons to be 1 μm or less, the first buffer layer serves as a field stop layer so that the percentage of leakage current non-defective products is not lower than 90% as shown in FIG. 6. However, when the acceleration voltage becomes higher than 100 keV, the donor integrated concentration of the $N^+$ first buffer layer cannot reach a donor integrated concentration ($1.2 \times 10^{12}$ atoms/cm$^2$ or higher) necessary for performing the function of the field stop layer and defects are dispersed in the wafer so that the depletion layer reaches the $P^+$ collector layer in an off state to cause increase of the leakage current. For this reason, the percentage of leakage current non-defective products is reduced as shown in FIG. 6.

When only the AlGaAs laser is applied, the temperature at a depth of 5 μm or less exceeds the melting point of silicon as shown in FIG. 7-3. The temperature even at a depth of 1 μm becomes lower than the melting point of silicon when the elapsed time is 200 ns or more. Accordingly, the depth where protons can be provided as donors is only 1 μm or less. In this case, protons cannot be provided as donors even at an acceleration voltage of 100 keV, so that a lot of chips having the $N^+$ first buffer layer incapable of performing the function of the field stop layer are formed. For this reason, the percentage of leakage current non-defective products is reduced as shown in FIG. 6.

In this manner, a depth which is obtained by simultaneous irradiation with the YAG 2ω laser and the AlGaAs laser so that the temperature at the depth exceeds the melting point of silicon becomes larger than the sum of depths which are obtained by single irradiation with the YAG 2ω laser and the AlGaAs laser respectively so that the temperature at each of the depths exceeds the melting point of silicon. It is conceived that this is caused by occurrence of such a nonlinear synergistic effect that the melting state and temperature distribution generated by irradiation with a short-wavelength laser such as a YAG 2ω laser are knocked on to a deeper region by irradiation with a long-wavelength laser such as an AlGaAs laser (hereinafter referred to as "knock-on effect"). The penetration length of the short-wavelength laser is about 1 μm and, preferably, 0.3-5 μm. Specifically, a solid-state pulse (all-solid-state) laser with a wavelength of about 500 nm such as YAG 2ω, YVO$_4$ 2ω or YLF 2ω is preferred, or a gas laser such as an excimer laser or a helium-neon (He—Ne) laser or a gallium nitride (GaN) semiconductor laser may be used instead. Actually, the solid-state pulse laser is preferred to the gas laser because high output power is required.

The penetration length of the long-wavelength laser is about 10 μm and, preferably, 5-30 μm, both inclusively. Specifically, a semiconductor laser with a wavelength of 700-3500 nm such as Al$_X$Ga$_{1-X}$As or In$_X$Ga$_{1-X}$As is preferred. The subscript X given to an element of the semiconductor laser indicates a stoichiometric composition ratio (normalized composition ratio). The wavelength can be controlled in the aforementioned range when the value of X is adjusted. As the long-wavelength laser, a ruby laser may be used instead. These lasers can perform continuous oscillation. Alternatively, a solid-state pulse laser of a normal frequency such as YAG, YVO$_4$ or YLF may be used instead.

Incidentally, another laser than the aforementioned lasers may be used as the short-wavelength laser or the long-wavelength laser if the same penetration length into silicon can be obtained.

Figure 8:
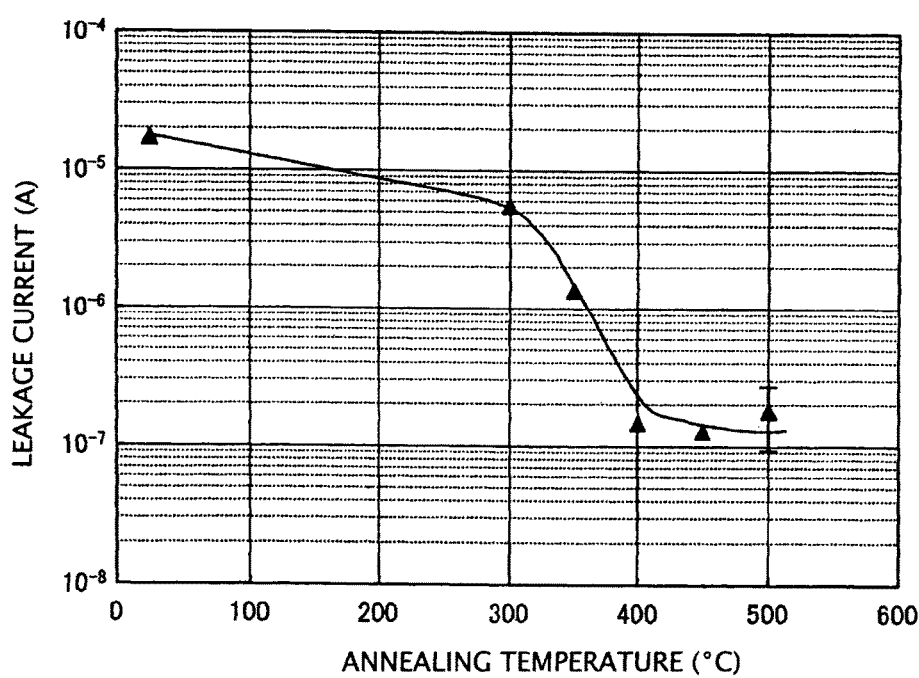
FIG. 8 is a graph showing a result of measurement of leakage current versus annealing temperature of an electric furnace in a semiconductor device according to the related art.

FIG. 8 shows a result of measurement of leakage current versus annealing temperature in a 1200 V class semiconductor device annealed in a related-art type electric furnace as a comparative example. In FIG. 8, the vertical axis shows leakage current, and the horizontal axis shows annealing temperature. Annealing in the electric furnace is different from laser annealing in that the whole of the wafer is heated to almost the same temperature by annealing in the electric furnace.

In the related-art semiconductor device shown in FIG. 8, a field stop layer formed from phosphorus is provided to prevent the leakage current from changing in accordance with change in the concentration of proton donors in accordance with the annealing temperature. The time required for annealing in the electric furnace is, for example, 1 hour.

As shown in FIG. 8, the leakage current of the device only irradiated with protons without heat treatment is about 20 μA (as plotted at a left end of FIG. 8). The reason why the leakage current is large as described above is that the depletion layer reaches a proton-projected range region to thereby increase the level density of deep levels (about 0.2 eV from the mid-cap) due to a large deal of defects in the projected range region and reduce the lifetime of the projected range region (about 10 ns).

On the other hand, when the temperature for heat treatment becomes higher than 300° C., the leakage current is reduced rapidly. At a temperature of 400° C. or higher, the leakage current converges to the order of 10 nA which is almost equal to the value of the leakage current without proton irradiation. This shows that at a temperature of 400° C. or higher, defects induced by proton irradiation are almost recovered to extinguish the deep levels to thereby raise the lifetime to a value equal to the bulk lifetime (50 μs or longer). That is, the lifetime becomes sufficient long when the temperature of the projected range region reaches about 400° C.

On the contrary, in the semiconductor device according to Embodiment 1, as shown in FIG. 7-1, a region deep by a smaller value than 50 µm from the irradiated surface is heated to a temperature of 600° C. or higher by laser irradiation, and silicon is melted in a region deep by a smaller than 30 µm from the irradiated surface. Accordingly, at least in the proton-projected range region, deep levels are extinguished and the lifetime is recovered to the value of the bulk lifetime. Moreover, shallow levels indicating donors (shallow donors) are not extinguished. This reason is that the melting temperature holding time is very short (shorter than 10 µs) differently from annealing in the electric furnace. It is obvious from the above description that increase of conduction loss caused by reduction of the lifetime can be suppressed in the semiconductor device according to Embodiment 1 because shallow donors can be formed without reduction of the lifetime differently from the related-art type semiconductor device.

Figure 9:
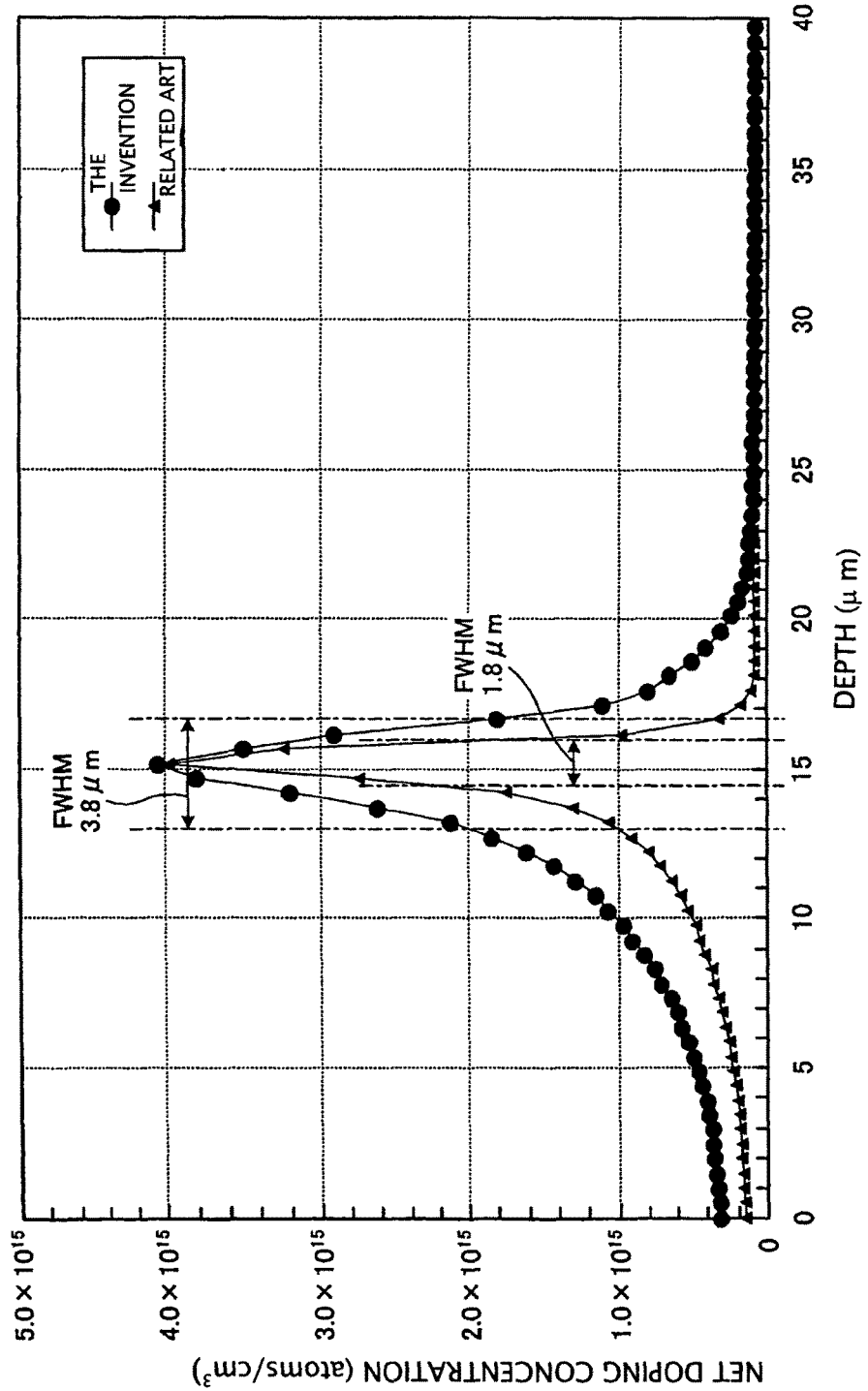
FIG. 9 is a graph showing results of conversion of the spreading resistance values of the semiconductor device according to Embodiment 1 and the semiconductor device according to the related art into carrier concentration values.

Next, values of spreading resistance were measured in the semiconductor device according to Embodiment 1 and the semiconductor device annealed in the electric furnace according to the related art. In the semiconductor device according to the related art, annealing was performed in the electric furnace at 350° C. for 1 hour after the processes of FIGS. 2-1 to 2-3 were performed, that is, after proton irradiation. FIG. 9 shows results of conversion of the measured resistance values into carrier concentrations. In FIG. 9, the vertical axis shows a net doping concentration, and the horizontal axis shows a distance from the wafer surface (proton-irradiated surface), that is, a depth from the wafer surface. As shown in FIG. 9, the peak value of the carrier concentration in the invention is $4.05 \times 10^{15}$ atoms/cm$^3$ which is equal to the peak value of the net doping concentration in the related art. On the other hand, the full width at half maximum of the net doping concentration in the invention is 3.8 µm which is about 2.1 times as wide as the full width (1.8 µm) at half maximum of the net doping concentration in the related art. This is caused by the aforementioned knock-on effect.

Figure 10:
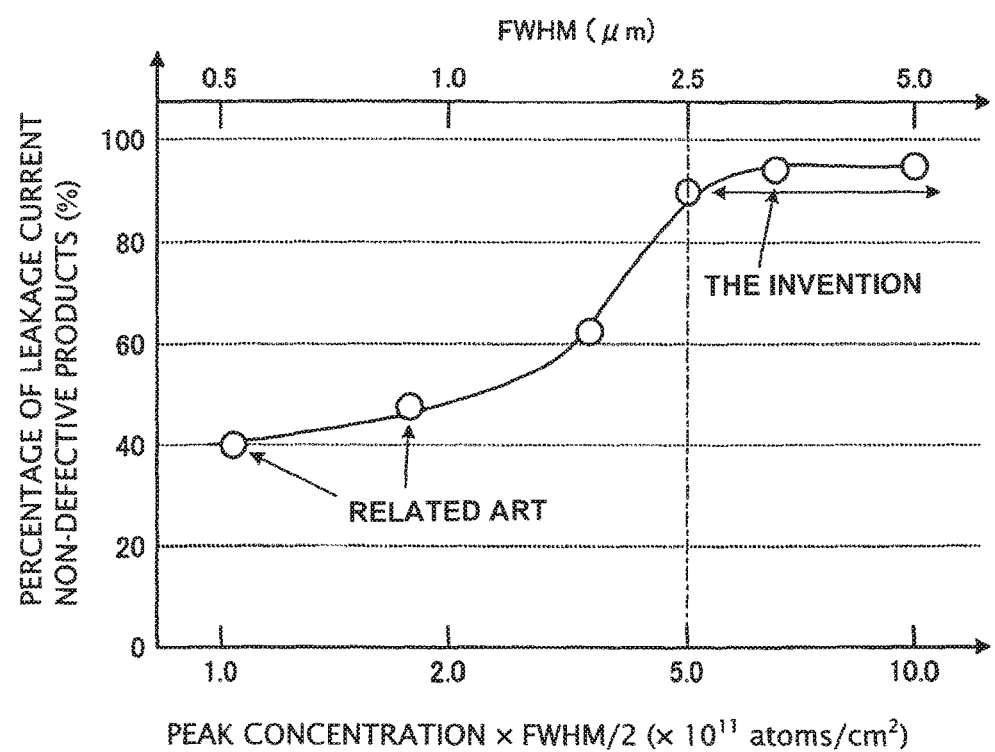
FIG. 10 is a graph showing the percentage of leakage current non-defective products versus a value obtained by multiplying a peak value of the net doping concentration and a full width at half maximum thereof.

Next, the percentage of leakage current non-defective products versus a value obtained by multiplying the peak value of the net doping concentration of the first buffer layer and the full width at half maximum thereof will be described. FIG. 10 is a graph showing the percentage of leakage current non-defective products versus a value obtained by multiplying the peak value of the net doping concentration and the full width at half maximum. The peak value of the net doping concentration is the peak value shown in FIG. 9. The decreasing rate of electric field intensity in the field stop layer is decided by the integrated concentration of the field stop layer. The concentration of the field stop layer formed by ion injection conforms almost to the Gaussian distribution. A method in which a value obtained by multiplying the peak concentration and the full width at half maximum and dividing the resulting product by 2 is approximated as the integrated concentration of the field stop layer on the assumption that the field stop layer is regarded as a triangle and the full width at half maximum and peak concentration of the field stop layer are regarded as the bottom side and height of the triangle, respectively, is used here as a method of calculating the integrated concentration of the field stop layer more easily and accurately. This value is hereinafter referred to as "F value". FIG. 10 shows the F value calculated based on numerical values shown in FIG. 9. As shown in FIG. 10, when the F value is not smaller than $5.0 \times 10^{11}$ atoms/cm$^2$, the percentage of leakage current non-defective products becomes 90% or higher. Accordingly, the F value of not smaller than $5 \times 10^{11}$ atoms/cm$^2$ is preferred and the F value of not smaller than $6 \times 10^{11}$ atoms/cm$^2$ is further preferred. This reason is that the field stop layer stops the depletion layer when the F value is not smaller than $5 \times 10^{11}$ atoms/cm$^2$. In addition, when the peak value of the carrier concentration is not smaller than $1 \times 10^{15}$ atoms/cm$^3$, the full width at half maximum of not smaller than 2.5 µm is preferred and the full width at half maximum of not smaller than 3 µm is further preferred. This reason is that the field stop layer stops the depletion layer when the peak value of the carrier concentration is in these ranges.

According to Embodiment 1, after a surface structure is formed in a front surface of a wafer and a rear surface of the wafer is ground, the rear surface of the wafer is irradiated with protons and then simultaneously irradiated with two kinds of lasers different in wavelength, so that the field stop layer can be formed in a position deep from the rear surface of the wafer without any influence on the surface structure formed in the front surface of the wafer. Accordingly, even when an avalanche current begins to flow based on application of a high voltage between the collector and the emitter in an off state of the device, the distance from an end portion of the depletion layer to the P$^+$ collector layer becomes long because the distance from a position where the net doping concentration of the N$^+$ field stop layer is locally maximized to the interface between the second N buffer layer and the P$^+$ collector layer is long. For this reason, the current is not concentrated into one place of the device, so that the snap-back phenomenon can be prevented. Hence, the device can be prevented from being destroyed by the snap-back phenomenon.

Figure 11:
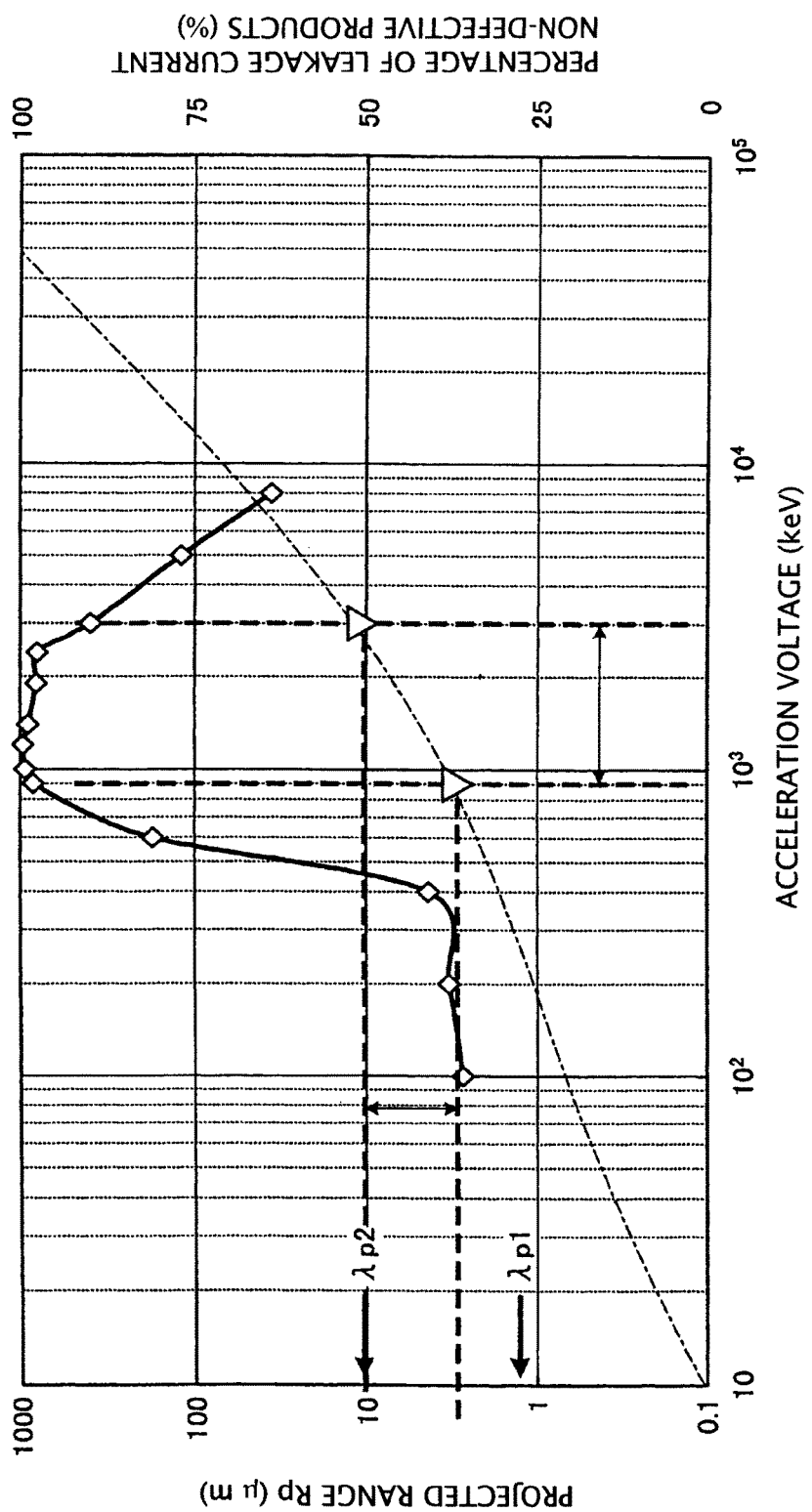
FIG. 11 is an explanatory graph showing a result of measurement of the projected range of helium ions and the percentage of leakage current non-defective products, versus acceleration voltage when helium ions were injected.
Figure 12:
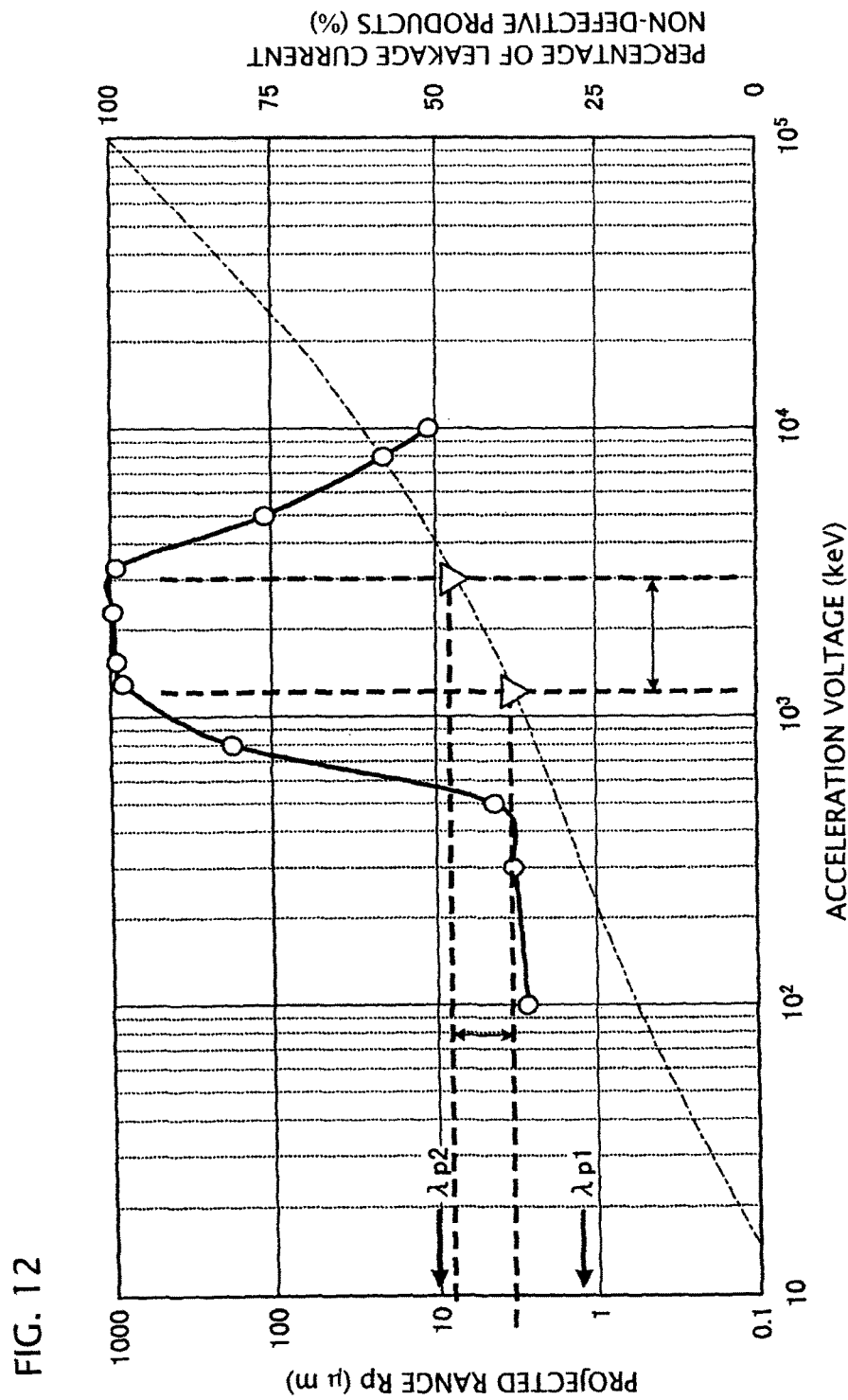
FIG. 12 is an explanatory graph showing a result of measurement of the projected range of lithium ions and the percentage of leakage current non-defective products, versus acceleration voltage when lithium ions were injected.
Figure 13:
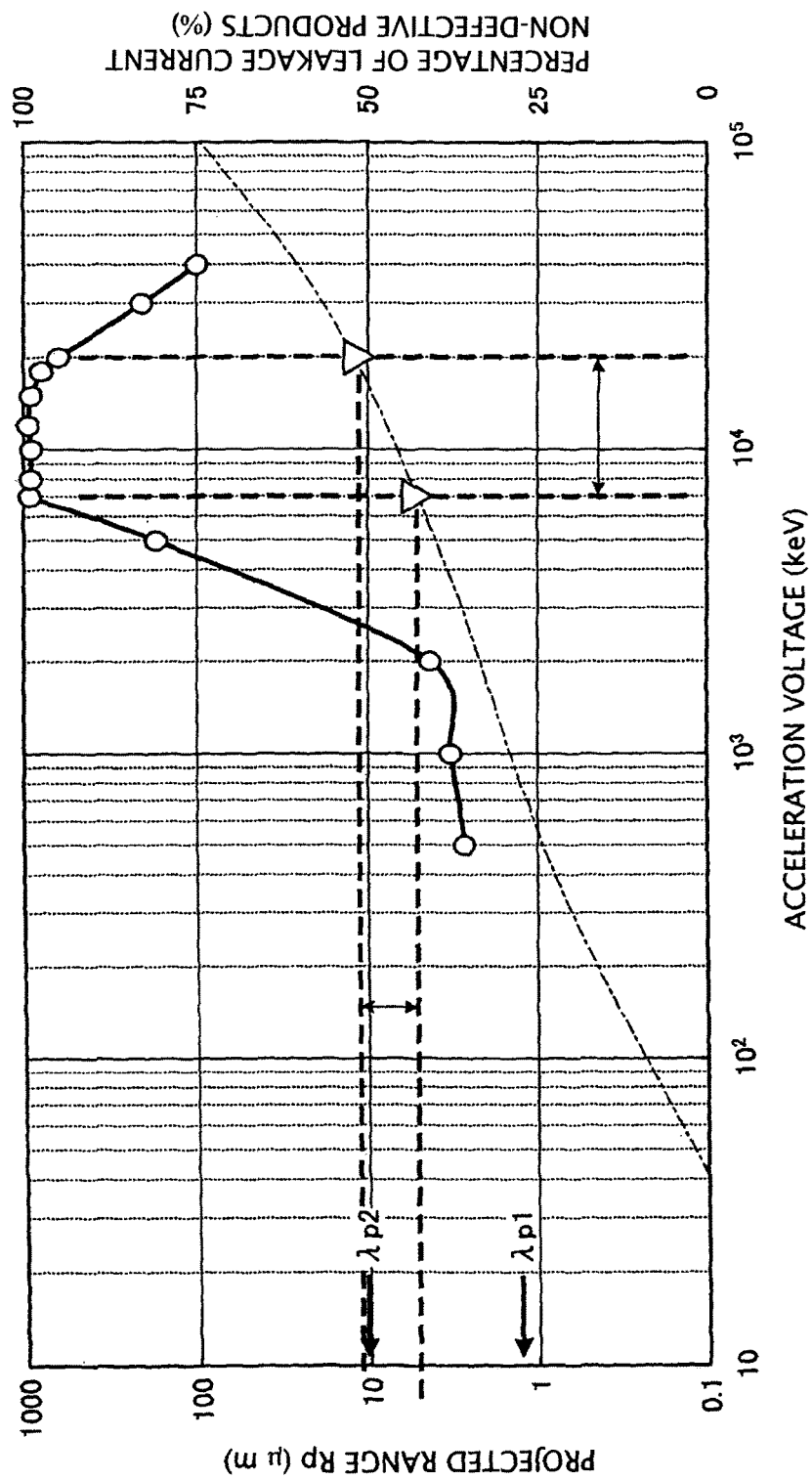
FIG. 13 is an explanatory graph showing a result of measurement of the projected range of oxygen ions and the percentage of leakage current non-defective products, versus acceleration voltage when oxygen ions were injected.

A semiconductor device according to Embodiment 2 will be described below. In the semiconductor device according to Embodiment 2, an N$^+$ first buffer layer is formed by injection of other ions than protons, differently from Embodiment 1. FIGS. 11 to 13 are explanatory graphs showing results of measurement of the projected range of ions and the percentage of leakage current non-defective products versus the acceleration voltage at the time of injection of each of helium ions (He$^{2+}$), lithium ions (Li$^+$) and oxygen ions (O$^+$). In FIGS. 11 to 13, the left side of the vertical axis shows the projected range of ions, the right side of the vertical axis shows the percentage of leakage current non-defective products, and the horizontal axis shows the acceleration voltage. The dose quantity of ions is $1 \times 10^{14}$ atoms/cm$^2$.

In FIGS. 11 to 13, the thick solid line expresses the percentage of leakage current non-defective products when a YAG 2ω laser (wavelength: 532 nm, penetration length λp1: 1.5 µm) and an AlGaAs laser (wavelength: 808 nm, penetration length λp2: 10 µm) as a GaAs semiconductor laser are applied simultaneously. The thin one-dot chain line expresses the projected range of ions.

As shown in FIG. 11, when helium ions are injected, the range of the acceleration voltage exhibiting 90% or higher as the percentage of leakage current non-defective products is narrow (about 900 keV to 3 MeV) compared with the case of injection of protons shown in FIG. 6. This reason is that the knock-on effect hardly occurs because the projected range of helium ions as expressed by the thin one-dot chain line in FIG. 11 is shallower than the projected range of protons as expressed by the thin one-dot chain line in FIG. 6.

As shown in FIG. 12, when lithium ions are injected, the range of the acceleration voltage exhibiting 90% or higher as the percentage of leakage current non-defective products is narrow (about 1.2 MeV to 3 MeV) compared with the case of injection of protons shown in FIG. 6.

As shown in FIG. 13, when oxygen ions are injected, the range of the acceleration voltage exhibiting 90% or higher as the percentage of leakage current non-defective products is about 7 MeV to 20 MeV. To increase the acceleration voltage to 1 MeV or higher, for example, a tandem electrostatic accelerator is used. To increase the acceleration voltage to 10 MeV or higher, for example, a circular accelerator (cyclotron) is used.

Incidentally, there is no existing practical equipment capable of injecting an element heavier than oxygen, such as phosphorus (P) or selenium (Se), into a required depth as the projected range because the projected range is not longer than 1 μm even when injection is performed at an acceleration voltage of MeV class.

It is hence to be understood that helium ions, lithium ions or oxygen ions are preferred as other elements to be injected than protons in accordance with Embodiment 2. As shown in FIG. 6 and FIGS. 11 to 13, it is found that the preferred acceleration voltage is 200 keV at minimum and 30 MeV at maximum and the preferred acceleration voltage for injection of protons is 2 MeV at maximum.

Figure 14:
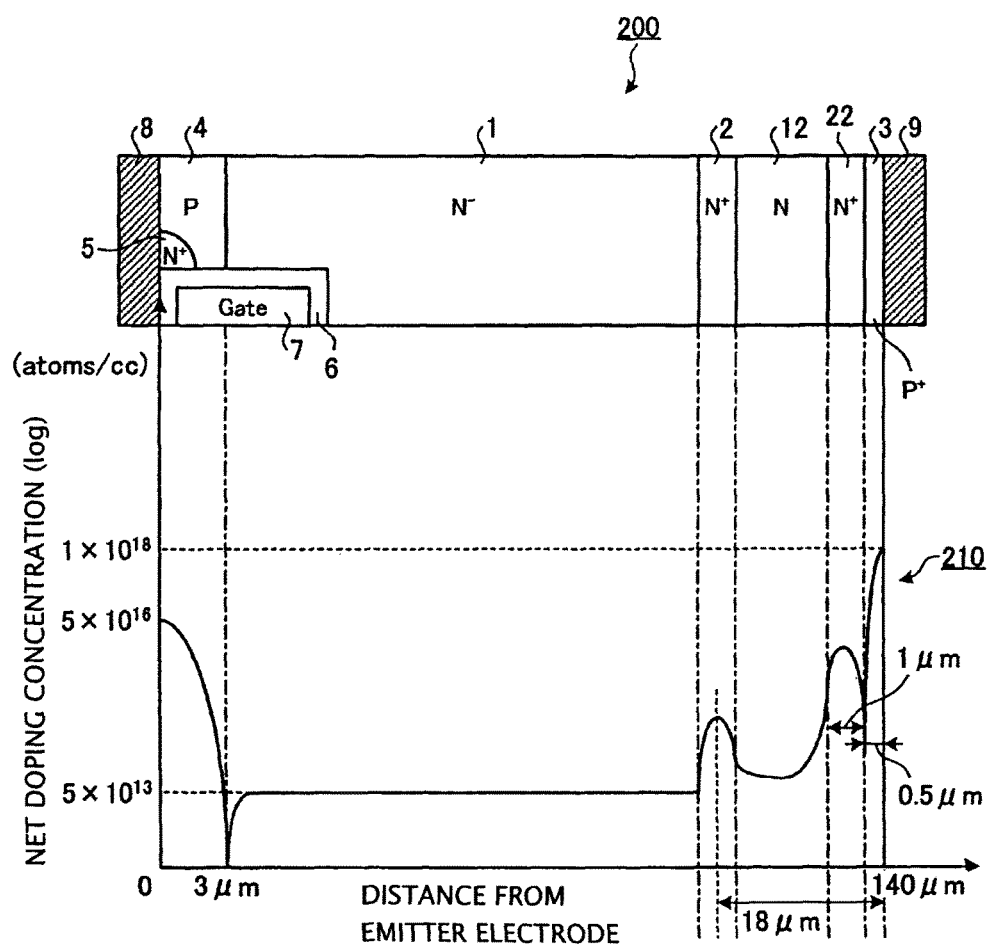
FIG. 14 is a view showing the configuration of a semiconductor device according to Embodiment 3 and the net doping concentration thereof.

FIG. 14 is a view showing the configuration and net doping concentration of a semiconductor device according to Embodiment 3. As shown in a section 200 of the semiconductor device in FIG. 14, the semiconductor device according to Embodiment 3 includes, in addition to the semiconductor device of Embodiment 1 shown in FIG. 1, an N$^+$ cathode buffer layer 22 (seventh semiconductor layer) provided between the N second buffer layer 12 and the P$^+$ collector layer 3 and being higher in concentration than the N second buffer layer 12. The other configuration is the same as in Embodiment 1 and like numerals refer to like parts for the sake of omission of duplicate description.

The net doping concentration and size of each portion of the semiconductor device according to Embodiment 3 are exemplified as an example. Incidentally, only values different from the values exemplified in Embodiment 1 will be described. As shown in a characteristic graph 210 of distance from the emitter electrode versus net doping concentration (log) in FIG. 14, the net doping concentration of the N$^+$ cathode buffer layer 22 is higher than the net doping concentration of the N$^+$ first buffer layer 2.

The distance from a position where the net doping concentration of the N$^+$ first buffer layer 2 is locally maximized to the interface between the P$^+$ collector layer 3 and the collector electrode 9, that is, the projected range Rp of protons is 18 μm. The distance from the interface between the N second buffer layer 12 and the N$^+$ cathode buffer layer 22 to the interface between the P$^+$ collector layer 3 and the collector electrode 9, that is, the thickness of the N$^+$ cathode buffer layer 22 is 1 μm. The distance from the interface between the N$^+$ cathode buffer layer 22 and the P$^+$ collector layer 3 to the interface between the P$^+$ collector layer 3 and the collector electrode 9, that is, the thickness of the P$^+$ collector layer 3 is 0.5 μm.

According to Embodiment 3, the depletion layer spread from the emitter side into the drift layer can be stopped more surely by the N$^+$ cathode buffer layer 22 before the depletion layer reaches the P$^+$ collector layer 3. Accordingly, the incomplete formation of the buffer layer can be prevented, so that the percentage of leakage current non-defective products can be improved more greatly.

Figure 15:
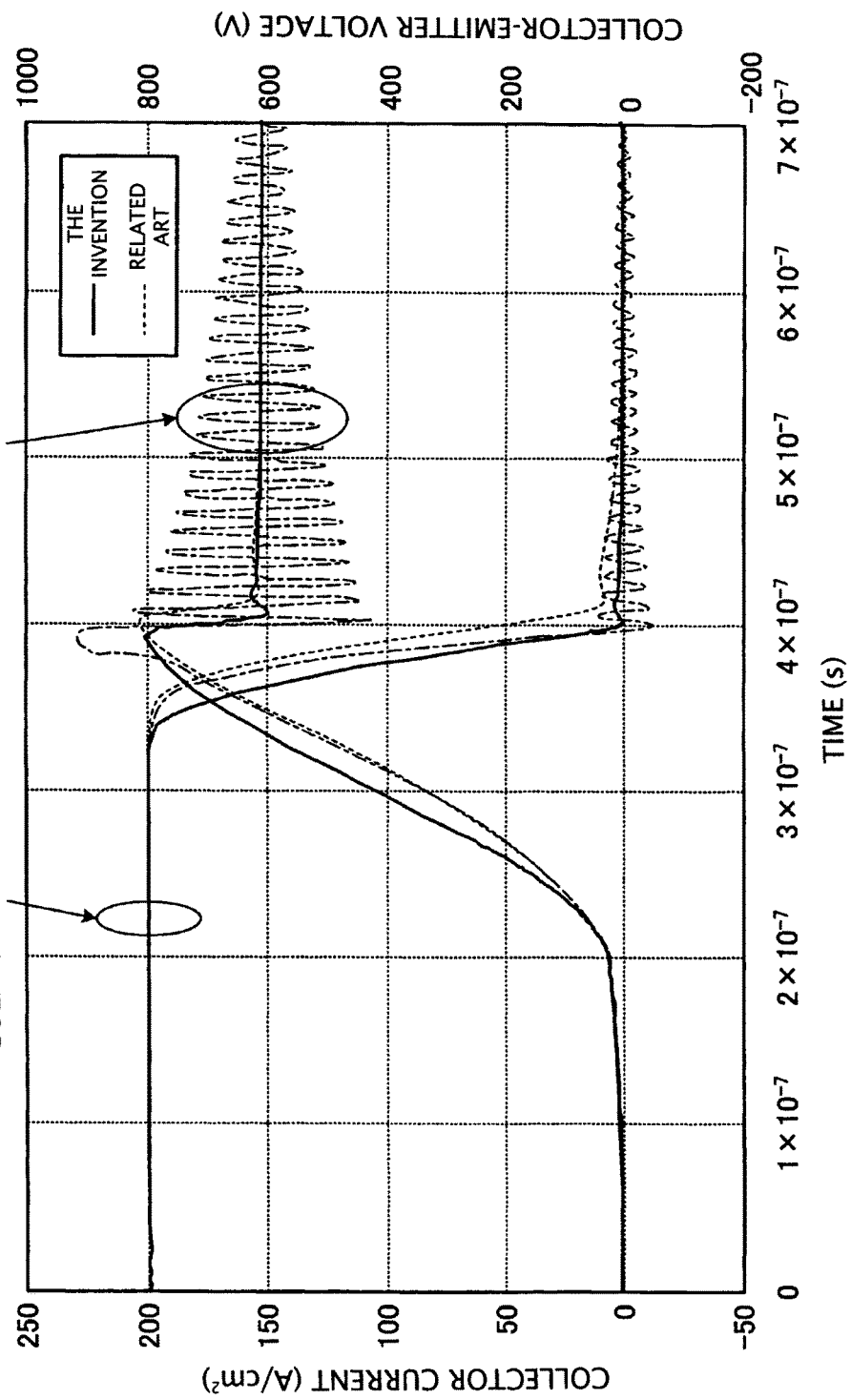
FIG. 15 is a graph showing turn-off waveforms of the semiconductor device according to the invention and the semiconductor device according to the related art.
Figure 19:
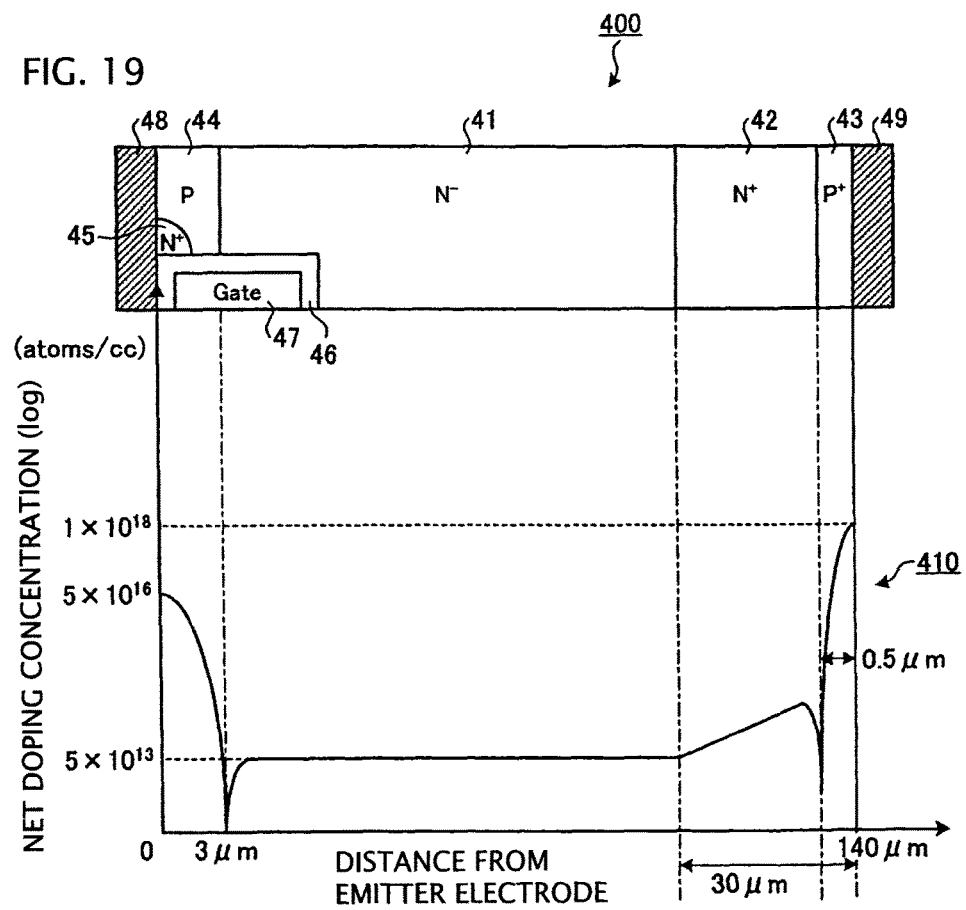
FIG. 19 is a view showing the configuration of a semiconductor device having a field stop layer according to the related art and the net doping concentration thereof.
Figure 20:
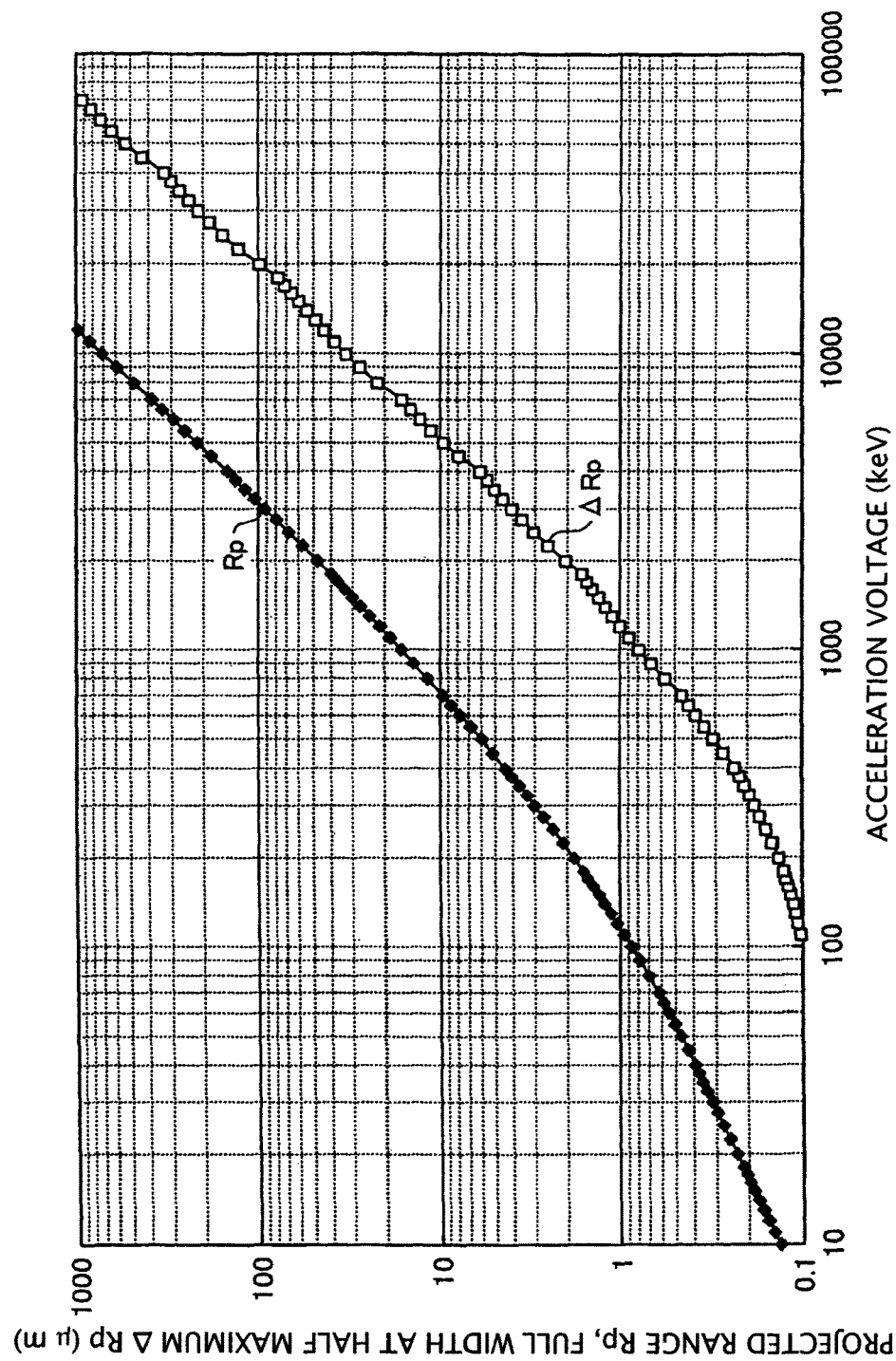
FIG. 20 is a graph showing results of SRIM2006's calculation of the projected range Rp of protons in silicon irradiated with protons and the FWHM ΔRp thereof in a hydrogen distribution after the irradiation.

FIG. 15 is a graph showing turn-off waveforms of the semiconductor device according to Embodiments 1 to 3 and the semiconductor device including the field stop layer according to the related art. In FIG. 15, the thick solid line expresses the collector current I$_C$ and collector-emitter voltage V$_C$ of the semiconductor device according to Embodiments 1 to 3. The thin broken line expresses the collector current I$_C$ and collector-emitter voltage V$_C$ of the semiconductor device including the field stop layer according to the related art (see FIG. 19).

Figure 16:
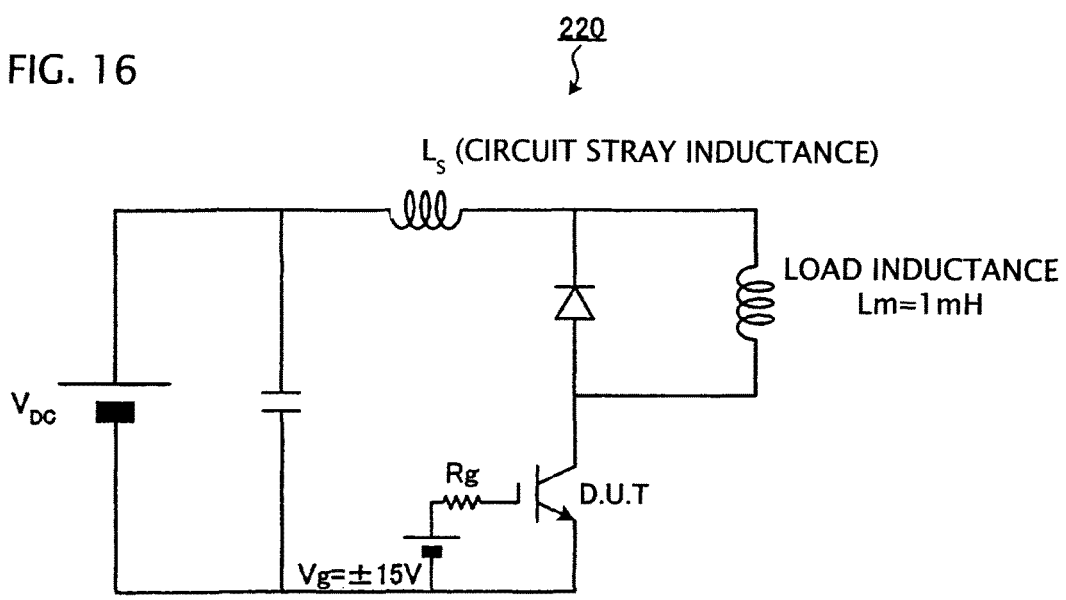
FIG. 16 is a diagram showing a snubberless circuit.

All the turn-off waveforms shown in FIG. 15 are waveforms in a snubberless circuit 220 shown in FIG. 16. The snubberless circuit 220 is a single-phase chopper circuit in which the IGBT according to the invention is disposed in a D.U.T. (device under test). The load inductance Lm of a main circuit of the snubberless circuit 220 is 1 mH, and the circuit stray inductance Ls of the main circuit is 200 nH. The gate resistance of the snubberless circuit 220 is 10Ω, and the gate drive voltage is ±15 V.

As shown in FIG. 15, the semiconductor device according to Embodiments 1 to 3 exhibits smooth switching waveforms without oscillation. The reason why oscillation does not occur is that stocked carriers are prevented from being exhausted at turn-off time. On the contrary, the semiconductor device according to the related art exhibits waveforms oscillated with 50 V increase in surge voltage because carriers are swept by spreading of the depletion layer so that stocked carriers are exhausted. This is a phenomenon the same as a so-called pinning effect of a space charge region as disclosed in JP-A-2003-318412.

Figure 17:
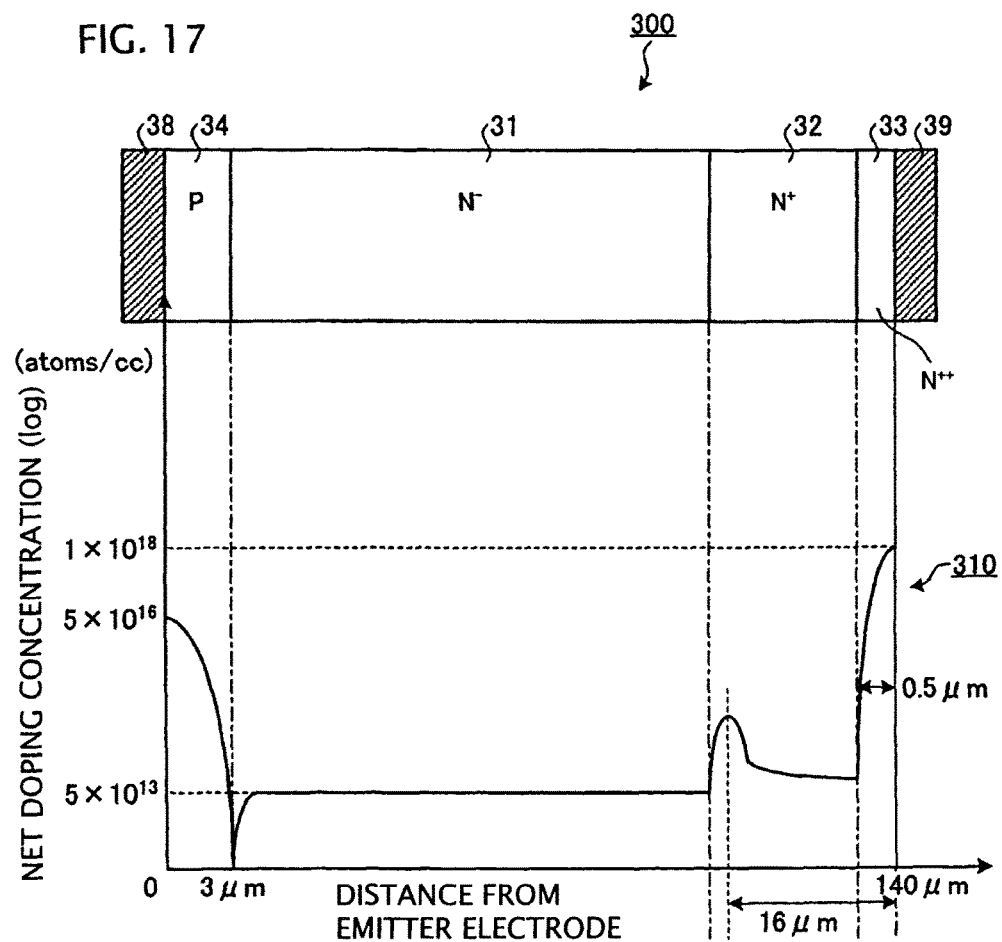
FIG. 17 is a view showing the configuration of a semiconductor device according to Embodiment 4 and the net doping concentration thereof.

FIG. 17 is a view showing the configuration and net doping concentration of a semiconductor device according to Embodiment 4. As shown in a section 300 of the semiconductor device in FIG. 17, an N$^+$ cathode buffer layer 32 as a second semiconductor layer and an N$^{++}$ cathode layer 33 as a third semiconductor layer are formed in this order, for example, on one principal surface side (first principal surface side) of an N$^-$ drift layer 31 as a first semiconductor layer. A P anode layer 34 as a fourth semiconductor layer is formed on the other principal surface side (second principal surface side) of the N$^-$ drift layer 31. An anode electrode 38 as a first electrode is formed on a surface of the P anode layer 34. A cathode electrode 39 as a second electrode is formed on a surface of the N$^{++}$ cathode layer 33. According to this structure, the semiconductor device according to Embodiment 4 performs the function of a diode.

As shown in a characteristic graph 310 of distance from the anode electrode versus net doping concentration (log) in FIG. 17, the net doping concentration of the N+ cathode buffer layer 32 has a peak in a position near the interface between the N$^+$ cathode buffer layer 32 and the N$^-$ drift layer 31 and is higher than the net doping concentration of the N$^-$ drift layer 31. The net doping concentration of the N+ cathode buffer layer 32 decreases with a gradient toward the interface between the N$^+$ cathode buffer layer 32 and the N$^{++}$ cathode layer 33. The net doping concentrations of the N$^{++}$ cathode layer 33 and the P anode layer 34 are higher than the net doping concentrations of the N$^-$ drift layer 31 and the N$^+$ cathode buffer layer 32.

In this manner, application of the invention to a diode permits achievement of an inverse recovery operation with suppression of oscillation as well as low loss. At the time of inverse recovery, the depletion layer is spread from the front surface side in the same manner as at the turn-off time, so that carriers are extinguished. In the semiconductor device according to Embodiment 4, sudden extinction of carriers can be suppressed to thereby achieve smooth inverse recovery without oscillation.

On the other hand, in the IGBT or the like using the invention, turn-off with suppression of oscillation and low loss can be achieved as described in Embodiments 1 to 3. At the turn-off time, the depletion layer is spread from the front surface side of the wafer, so that carriers are extinguished. However, smooth turn-off without oscillation can be achieved because sudden extinction of carriers can be suppressed. Accordingly, a low-loss and soft-recovery diode and an IGBT capable of performing smooth turn-off without oscillation can be produced. In addition, in a power conversion apparatus such as a PWM inverter using an IGBT module having such characteristics, overvoltage destruction and occurrence of EMI noise can be suppressed.

Figures 1, 18:
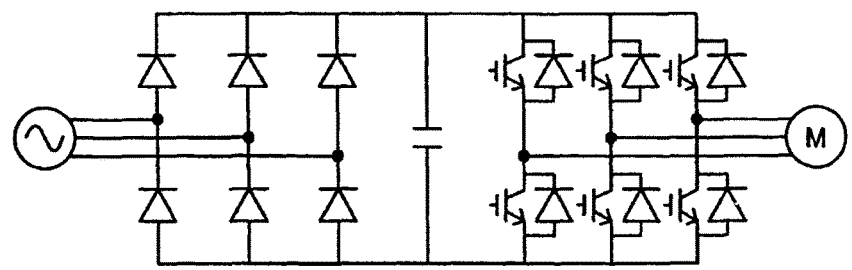
Figures 2, 18:
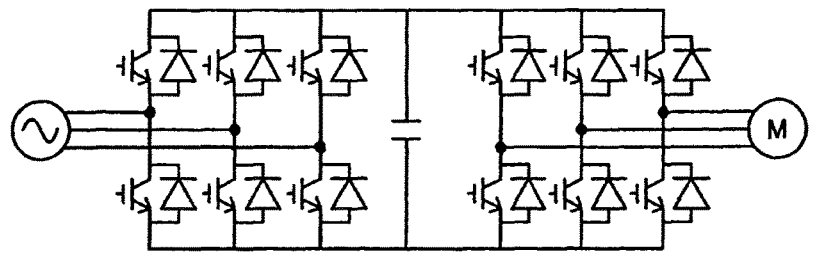

FIGS. 18-1 and 18-2 are diagrams showing applied examples of IGBTs and diodes according to Embodiments 1 to 4. Converter-inverter circuits shown in FIGS. 18-1 and 18-2 can control induction motors, servomotors, etc. efficiently and are widely used in industries, electric railroads, etc. FIG. 18-1 shows an example of application of diodes to a converter portion. FIG. 18-2 shows an example of application of IGBTs to a converter portion. In each of the examples, IGBTs are applied to an inverter portion. A free wheeling diode (FWD) is connected in parallel with each IGBT.

In the above, the invention is not limited to the aforementioned embodiments and may be changed variously. For example, various values such as sizes, concentrations, voltage values, current values, treating conditions such as temperature and time, etc. described in the embodiments are only exemplary, so that the invention is not limited to those values. Although the respective embodiments have been described on the case where the first conductivity type is an N type and the second conductivity type is a P type, the invention can be effected also in the case where the first conductivity type is a P type and the second conductivity type is an N type.

Moreover, the invention can be applied not only to a 1200 V class but also to a 600 V class, a 1700 V class or a withstand voltage class higher than the 1700 V class. For example, in the case of a 1700 V class, the specific resistance of the wafer is 80-200 Ωcm and the final thickness of the wafer is 120-200 μm. In the case of a 3300 V class, the specific resistance of the wafer is 200-500 Ωcm and the final thickness of the wafer is 250-400 μm.

As described above, the semiconductor device and the method of producing the semiconductor device according to the invention are useful for a power semiconductor device and particularly adapted to a diode or an IGBT having soft recovery characteristics as well as high-speed and low-loss characteristics and having environmental friendliness.

The invention has been described with reference to certain preferred embodiments thereof. It will be understood, however, that modifications and variations are possible within the scope of the appended claims.

This application is based on, and claims priority to, Japanese Patent Application No: 2008-013018, filed on Jan. 23, 2008. The disclosure of the priority application, in its entirety, including the drawings, claims, and the specification thereof, is incorporated herein by reference.

What is claimed is:

1. A method of producing a semiconductor device, said method comprising the steps of:
grinding a first principal surface of a semiconductor substrate of a first conductivity type as a first semiconductor layer;
injecting light ions into a surface of the first semiconductor layer exposed by the grinding;
injecting p-type conductivity ions into the surface of the first semiconductor layer exposed by the grinding;
irradiating the surface injected with the light ions and p-type conductivity ions with two types of laser beams different in wavelength to thereby electrically activate the injected light ions and form an n-type first buffer layer and an n-type second buffer layer;
forming a p-type collector layer from the injected p-type conductivity ions; and
forming an electrode by laminating a metal film on the surface irradiated with the laser beams,
wherein the injecting of the light ions into the surface of the first semiconductor layer exposed by the grinding is to an injection depth, the injection depth being, at a peak position of injection, at least 5 μm to 30 μm, both inclusively, plus a depth of the p-type collector layer,
wherein a penetration length of a short-wavelength laser beam as one of the two types of laser beams into the semiconductor substrate is in a range of 0.3 μm to 5 μm, both inclusively,
wherein a penetration length of a long-wavelength laser beam as the other of the two types of laser beams into the semiconductor substrate is in a range of 5 μm to 30 μm, both inclusively,
wherein the long-wavelength laser beam is emitted from either an $Al_XGa_{1-X}As$ laser or an $In_XGa_{1-X}As$ laser in which X expresses a normalized composition ratio,
wherein a doping concentration of the n-type second buffer layer is lower than a doping concentration of the n-type first buffer layer and a doping concentration of the p-type collector layer, and the doping concentration of the n-type second buffer layer is higher than a doping concentration of the first semiconductor layer,
wherein the p-type collector layer is separated from the n-type first buffer layer by the n-type second buffer layer,
wherein the irradiating with two types of laser beams electrically activates the light ions and provides the light ions as donors by changing a state of silicon to a melted state in a region to a melted-state depth of 30 μm from the surface of the first semiconductor layer exposed by the grinding, and
wherein a full width at half maximum of a peak doping concentration of the n-type first buffer layer is not smaller than 2.5 μm.

2. A method of producing a semiconductor device according to claim 1, wherein the irradiating step performs simultaneous irradiation with the two types of laser beams different in wavelength.

3. A method of producing a semiconductor device according to claim 1, wherein the short-wavelength laser beam is emitted from an all-solid-state laser, a gallium nitride-including semiconductor laser, or a gas laser, the all-solid-state laser selected from the group consisting of a YAG 2ω laser, a YVO4 2ω laser, and a YLF 2ω laser, and the gas laser selected from the group consisting of an excimer laser and a helium-neon laser.

4. A method of producing a semiconductor device according to claim 1, wherein the long-wavelength laser beam is emitted from a semiconductor laser containing gallium as part of its structure, a ruby laser, or a normal-frequency all-solid-state laser selected from the group consisting of a YAG laser, a $YVO_4$ laser, and a YLF laser.

5. A method of producing a semiconductor device according to claim 1, wherein the light ions are selected from the group consisting of protons, helium ions, lithium ions, and oxygen ions.

6. A method of producing a semiconductor device according to claim 1, wherein the light ions are protons.

7. A method of producing a semiconductor device according to claim 5, wherein the injecting light ions step injects the light ions at an acceleration voltage in a range of 200 keV to 30 MeV, both inclusively.

8. A method of producing a semiconductor device according to claim 6, wherein the injecting light ions step injects protons at an acceleration voltage in a range of 200 keV to 2 MeV, both inclusively.

9. A method of producing a semiconductor device according to claim 1, wherein the p-type collector layer is formed by electrically activating the p-type conductivity ions.

10. A method of producing a semiconductor device, said method comprising the steps of:
grinding a first principal surface of a semiconductor substrate of a first conductivity type as a first semiconductor layer;
injecting light ions into a surface of the first semiconductor layer exposed by the grinding;
injecting p-type conductivity ions into the surface of the first semiconductor layer exposed by the grinding;
irradiating the surface injected with the light ions and p-type conductivity ions with two types of laser beams different in wavelength to thereby electrically activate the injected light ions and form an n-type first buffer layer and an n-type second buffer layer;
forming a p-type collector layer from the injected p-type conductivity ions;
forming an electrode by laminating a metal film on the surface irradiated with the laser beams; and
forming a surface structure on a second surface of the semiconductor substrate,
wherein a penetration length of a short-wavelength laser beam as one of the two types of laser beams into the semiconductor substrate is in a range of 0.3 μm to 5 μm, both inclusively,
wherein a penetration length of a long-wavelength laser beam as the other of the two types of laser beams into the semiconductor substrate is in a range of 5 μm to 30 μm, both inclusively,
wherein the injecting light ions step injects the light ions into the surface of the first semiconductor layer exposed by the grinding to an injection depth, the injection depth being, at a peak position of injection, at least 5 μm to 30 μm, both inclusively, plus a depth of the p-type collector layer,
wherein the injecting light ions step introduces damage within the injection depth, the damage reducing carrier lifetime and carrier mobility,
wherein the irradiating step, involving the irradiating with the two types of laser beams different in wavelength, provides protons as donors and reduces the damage within the injection depth at least by extinguishing deep levels within the injection depth without extinguishing shallow levels within the injection depth, the deep levels being deeper from the surface injected with the light ions than the shallow levels,
wherein the light ions are protons,
wherein a doping concentration of the n-type second buffer layer is lower than a doping concentration of the n-type first buffer layer and a doping concentration of the p-type collector layer, and the doping concentration of the n-type second buffer layer is higher than a doping concentration of the first semiconductor layer,
wherein the p-type collector layer is separated from the n-type first buffer layer by the n-type second buffer layer,
wherein the irradiating with two types of laser beams electrically activates the light ions and provides the light ions as donors by changing a state of silicon to a melted state in a region to a melted-state depth of 30 μm from the surface of the first semiconductor layer exposed by the grinding, and
wherein a full width at half maximum of a peak doping concentration of the n-type first buffer layer is not smaller than 2.5 μm.

* * * * *